United States Patent
Willmeroth

(10) Patent No.: US 10,014,367 B2
(45) Date of Patent: Jul. 3, 2018

(54) SEMICONDUCTOR DEVICE INCLUDING AN EDGE CONSTRUCTION WITH STRAIGHT SECTIONS AND CORNER SECTIONS

(71) Applicant: Infineon Technologies Austria AG, Villach (AT)

(72) Inventor: Armin Willmeroth, Friedberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/404,372

(22) Filed: Jan. 12, 2017

(65) Prior Publication Data

US 2017/0200791 A1 Jul. 13, 2017

(30) Foreign Application Priority Data

Jan. 13, 2016 (DE) .................... 10 2016 100 519

(51) Int. Cl.
| | |
|---|---|
| *H01L 29/06* | (2006.01) |
| *H01L 29/36* | (2006.01) |
| *H01L 29/41* | (2006.01) |

(52) U.S. Cl.
CPC ...... *H01L 29/0615* (2013.01); *H01L 29/0603* (2013.01); *H01L 29/0607* (2013.01); *H01L 29/0611* (2013.01); *H01L 29/36* (2013.01); *H01L 29/41* (2013.01)

(58) Field of Classification Search
CPC . H01L 29/36; H01L 29/0603; H01L 29/0607; H01L 29/0611; H01L 29/0615
See application file for complete search history.

(56) References Cited

U.S. PATENT DOCUMENTS

| | | | |
|---|---|---|---|
| 9,184,277 B2 | 11/2015 | Willmeroth et al. | |
| 2015/0333168 A1* | 11/2015 | Hirler ................ | H01L 29/0615 257/329 |

FOREIGN PATENT DOCUMENTS

| | | |
|---|---|---|
| DE | 102013112009 A1 | 4/2014 |
| DE | 102014105986 A1 | 11/2014 |
| DE | 102015107456 A1 | 11/2015 |

* cited by examiner

*Primary Examiner* — Fei Fei Yeung Lopez
(74) *Attorney, Agent, or Firm* — Murphy, Bilak & Homiller, PLLC

(57) ABSTRACT

A semiconductor device includes a transistor cell area with active transistor cells including source zones electrically connected to a first load electrode. The source zones have a first conductivity type. An edge area surrounds the active transistor cell area and includes an edge construction that includes straight sections and a corner section connecting neighboring straight sections. A second dopant ratio between a mean concentration of dopants of a complementary second conductivity type and a mean concentration of dopants of the first conductivity type in the corner section exceeds a first dopant ratio between a mean concentration of dopants of the second conductivity type and a mean concentration of dopants of the first conductivity type in the straight sections by at least 0.2% in relation to the first dopant ratio.

26 Claims, 21 Drawing Sheets

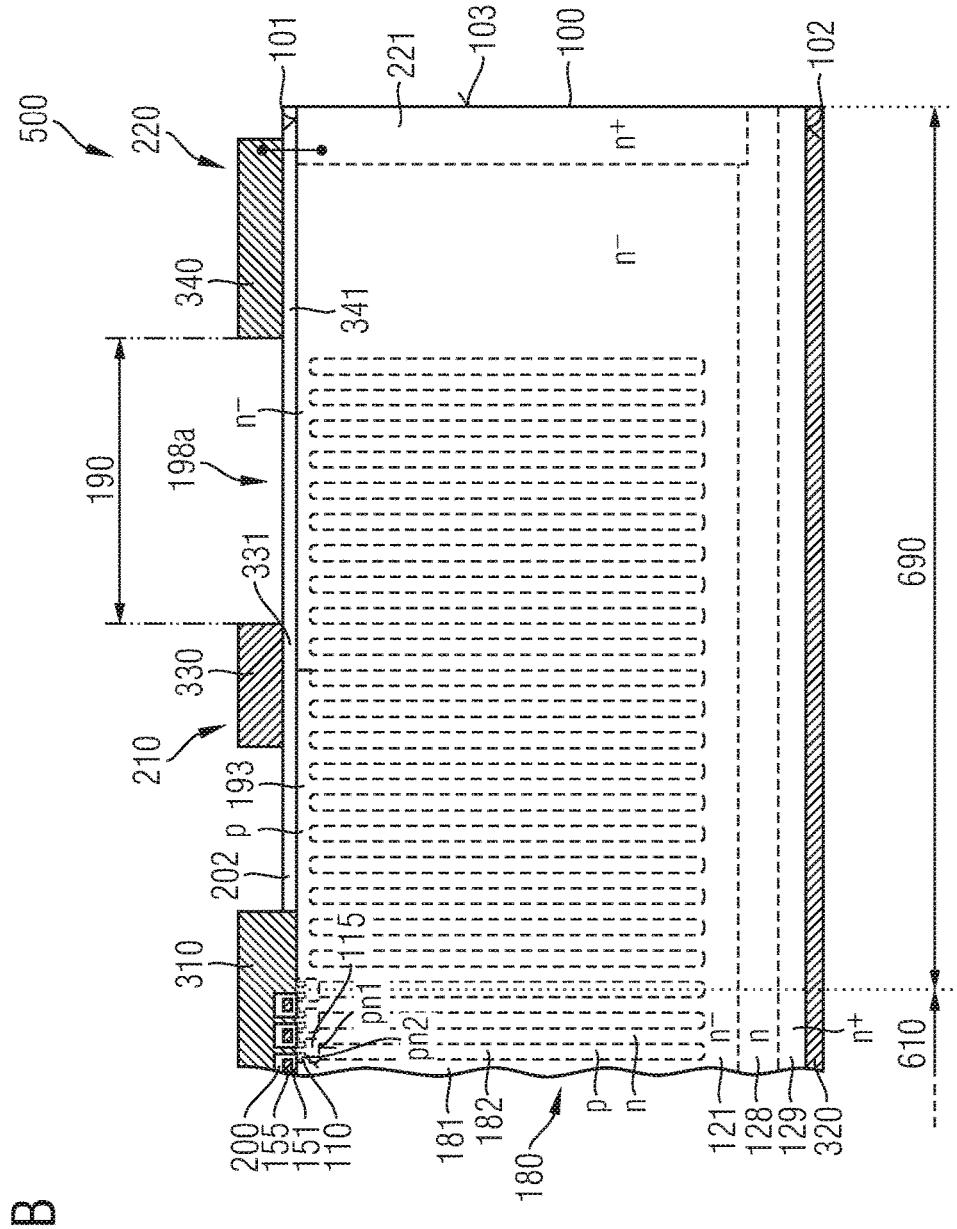

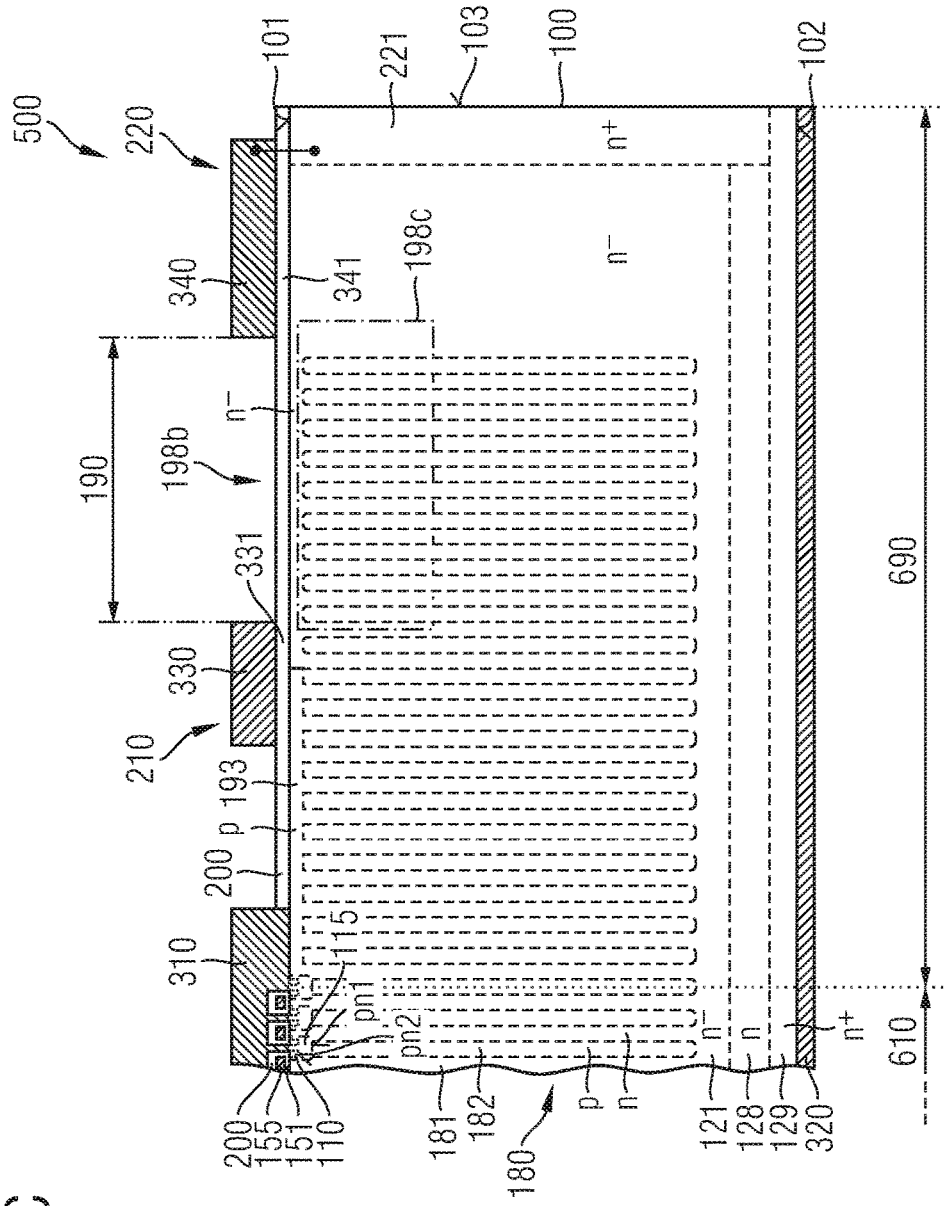

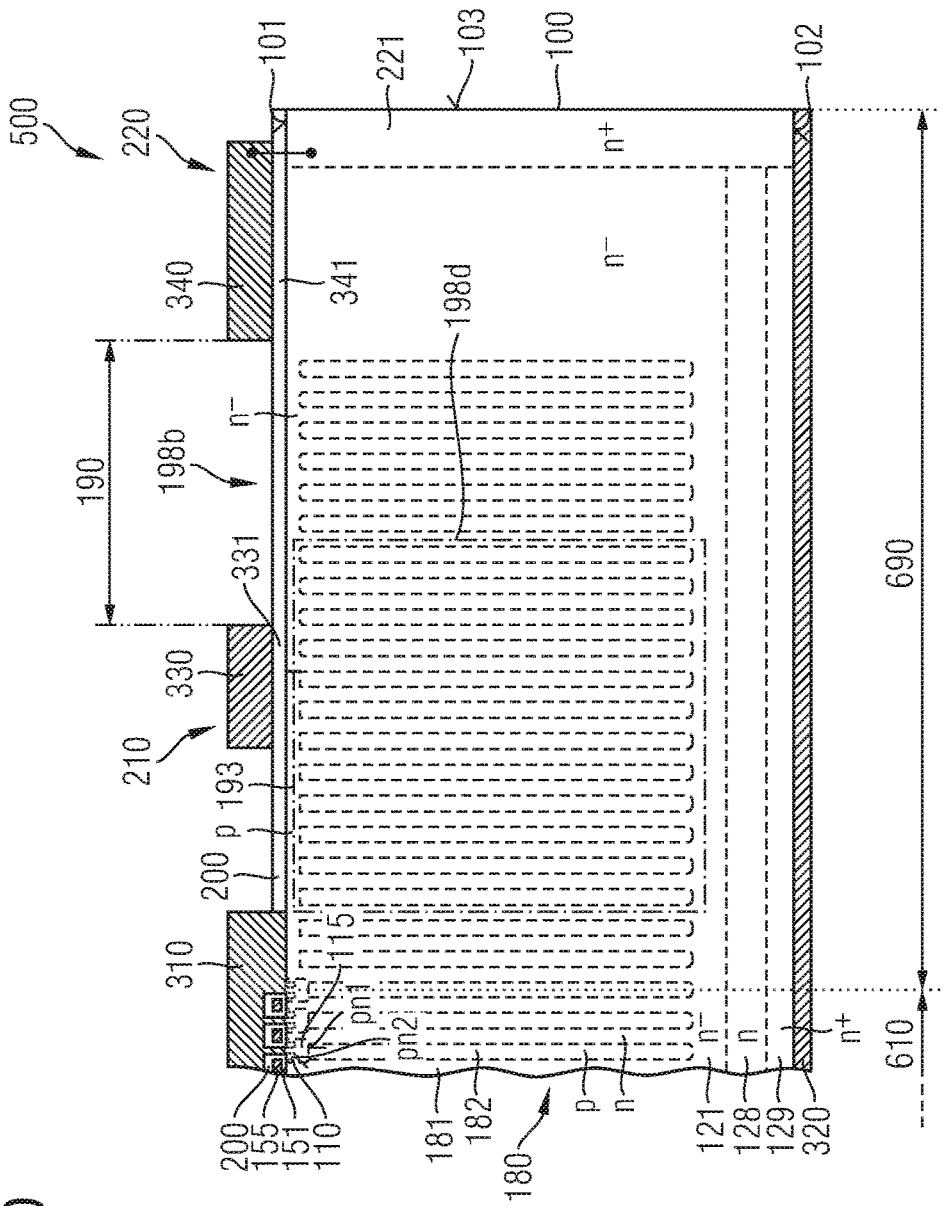

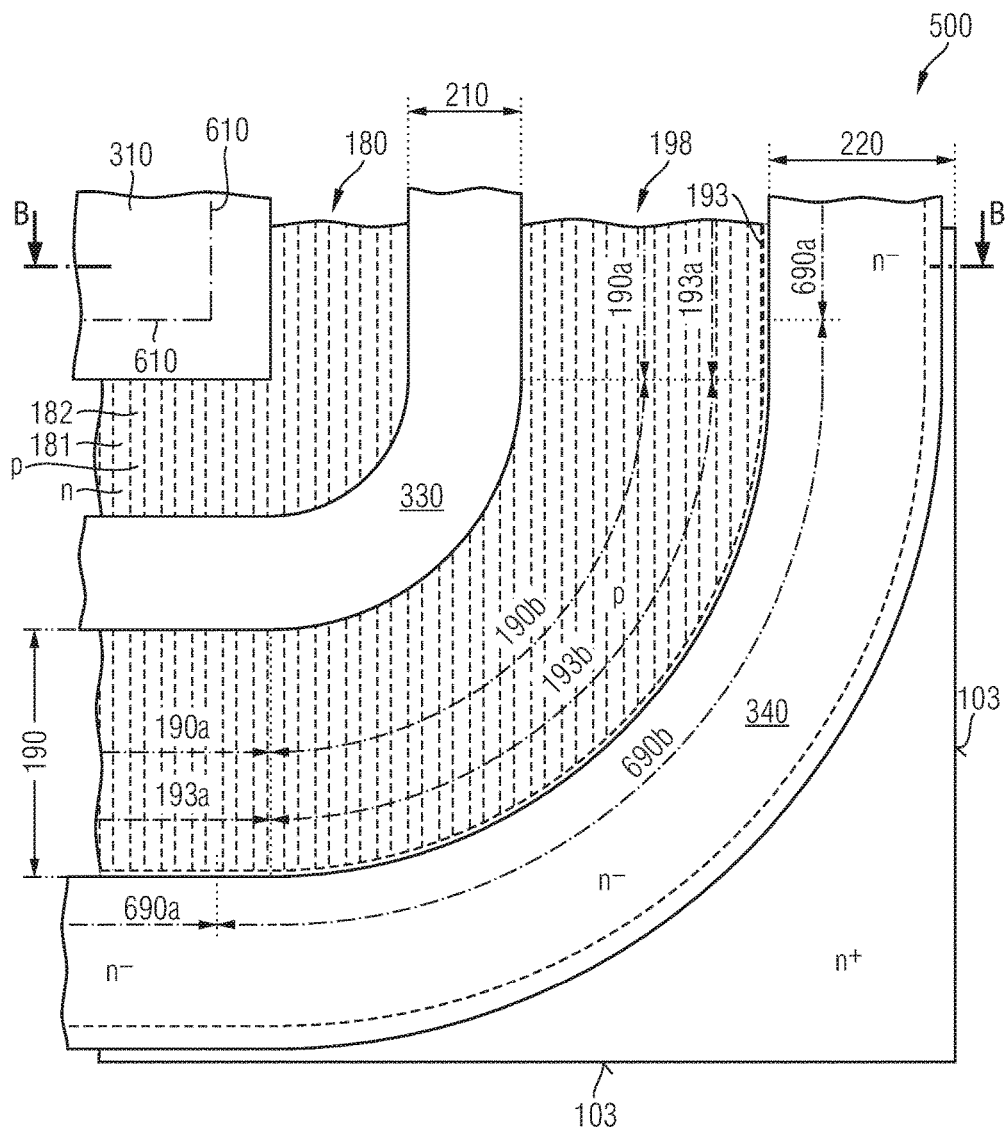

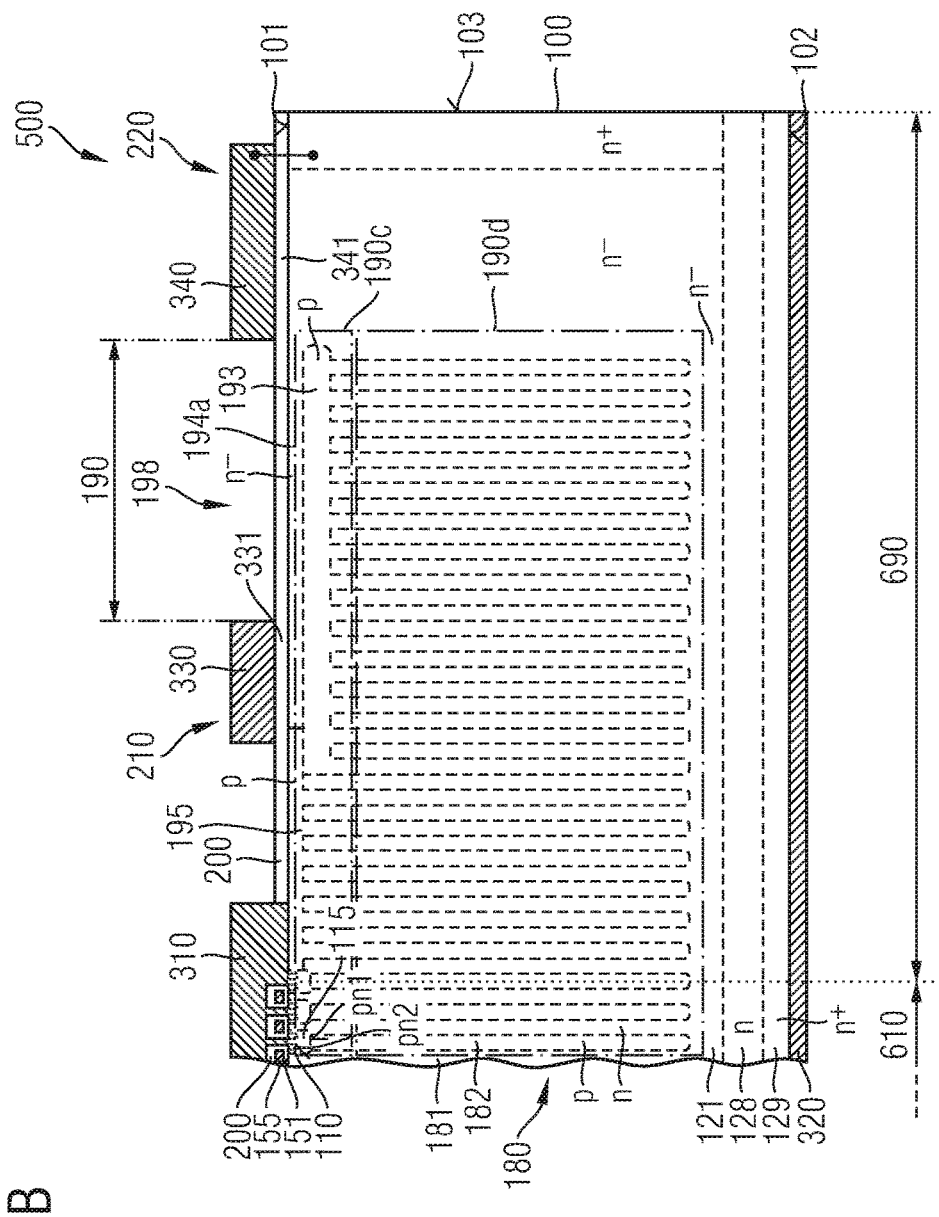

US 10,014,367 B2

SEMICONDUCTOR DEVICE INCLUDING AN EDGE CONSTRUCTION WITH STRAIGHT SECTIONS AND CORNER SECTIONS

BACKGROUND

In power semiconductor devices a blocking voltage is typically applied between a first load electrode at a front side and a second load electrode on the back of a semiconductor die. Since along an outer lateral surface of the semiconductor die the blocking capability of the semiconductor material is low, a termination construction along the outer lateral surface typically brings the potential applied to the second load electrode to the front side and accommodates the blocking voltage in the lateral direction. Since along the surface at the front side the blocking capability is lower than within the semiconductor die, the termination construction is comparatively wide and consumes significant portions of the available chip area.

It is desirable to improve the blocking capability of power semiconductor devices at low loss of available active chip area.

SUMMARY

According to an embodiment a semiconductor device includes a transistor cell area with active transistor cells including source zones electrically connected to a first load electrode. The source zones have a first conductivity type. An edge area surrounds the active transistor cell area and includes an edge construction that includes straight sections and a corner section connecting neighboring straight sections. A second dopant ratio between a mean concentration of dopants of a complementary second conductivity type and a mean concentration of dopants of the first conductivity type in the corner section exceeds a first dopant ratio between a mean concentration of dopants of the second conductivity type and a mean concentration of dopants of the first conductivity type in the straight sections by at least 0.2% in relation to the first dopant ratio.

According to another embodiment a semiconductor device includes an active transistor cell area with active transistor cells including source zones electrically connected to a first load electrode. The source zones have a first conductivity type. A superjunction structure includes first semiconductor regions of the first conductivity type and second semiconductor regions of a complementary second conductivity type. An edge area surrounds the active transistor cell area and includes an edge construction. The edge construction includes straight sections and a corner section connecting neighboring straight sections. A second dopant ratio between a mean concentration of dopants of the second conductivity type and a mean concentration of dopants of the first conductivity type in the corner section exceeds a first dopant ratio between a mean concentration of dopants of the second conductivity type and a mean concentration of dopants of the first conductivity type in the straight sections by at least 0.2% in relation to the first dopant ratio.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5B is a schematic vertical cross-sectional view of the corner portion of FIG. 5A along line B-B.

FIG. 5C as a schematic vertical cross-sectional view of the corner portion of FIG. 5A along line C/D-C/D according to an embodiment with a vertical variation of doping within a corner section.

FIG. 5D is a schematic vertical cross-sectional view of the corner portion of FIG. 5A along line C/D-C/D according to an embodiment with a lateral variation of doping within a corner section.

FIG. 6A is a schematic plan view of a corner portion of a semiconductor device according to an embodiment including a junction termination extension including differently doped straight and corner sections.

FIG. 9B is a schematic vertical cross-sectional view of the corner portion of FIG. 9A along line B-B.

DETAILED DESCRIPTION

Figure 1A:
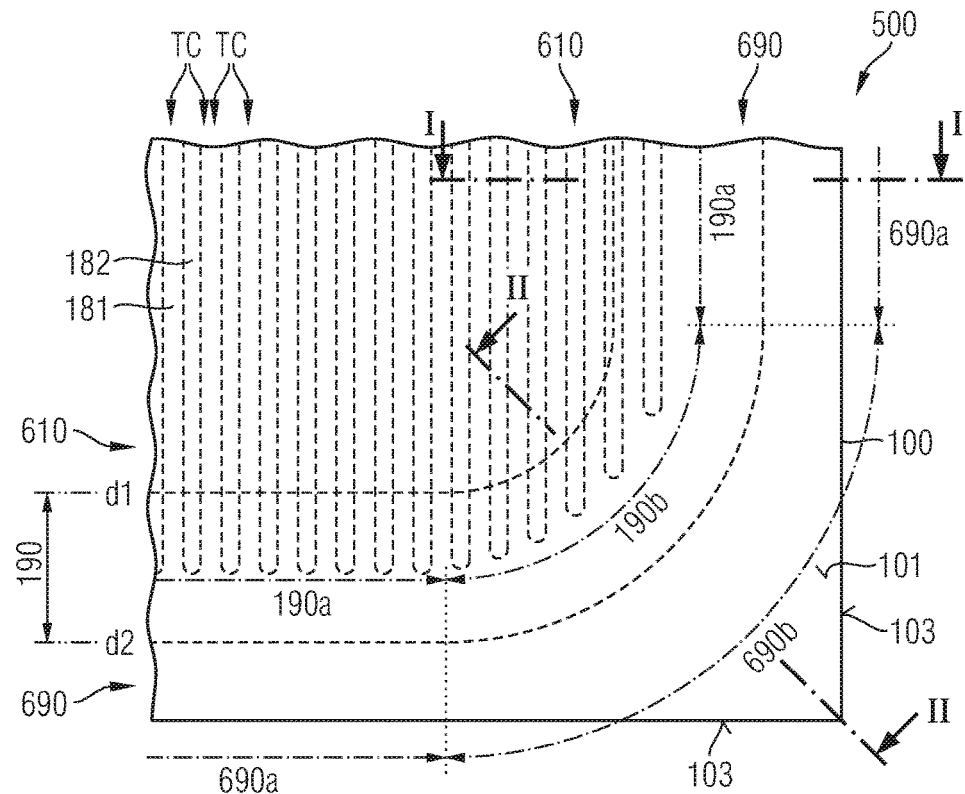
FIG. 1A is a schematic plan view of a corner portion of a semiconductor portion with different mean dopant ratios in corner sections and straight sections of an edge construction according to an embodiment.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to a semiconductor device 500 including active transistor cells TC. The semiconductor device 500 may be or may include an IGFET (insulated gate field effect transistor), for example, an MOSFET (metal oxide semiconductor FET) in the usual meaning including FETs with metal gates as well as FETs with gates formed from semiconducting material such as polycrystalline silicon. According to other embodiments, the semiconductor device 500 may be or may include an IGBT (insulated gate bipolar transistor).

The semiconductor device 500 is based on a semiconductor portion 100 from a crystalline semiconductor material such as silicon (Si), silicon carbide (SiC), germanium (Ge), a silicon germanium crystal (SiGe) or an $A_{III}B_V$ semiconductor. The semiconductor portion 100 has a first surface 101 at a front side and a second surface parallel to the first surface 101 on the back. A distance between the first surface 101 and the second surface is at least 25 μm, by way of example. An outer lateral surface 103 connects the first surface 101 and the second surface 102. In the viewing plane, the semiconductor portion 100 may have a rectangular shape with an edge length in the range of several millimeters. A normal to the first surface 101 defines a vertical direction and directions orthogonal to the vertical direction are horizontal directions. The outer lateral surface 103 is tilted, e.g., vertical to the first surface 101 and the second surface.

The active transistor cells TC are formed in a transistor cell area 610 in the horizontal center of the semiconductor portion 100. The active transistor cells TC are directly connected to a first load electrode disposed at the front side. The active transistor cells TC are controllable and can be switched between an on-state, in which the active transistor cells TC convey a load current between the first surface 101 and the second surface, and a blocking state, in which at most a low leakage current flows between the first surface 101 and the second surface 102. The active transistor cells TC may be stripe-shaped and may form a regular pattern of equally spaced stripes.

An edge area 690 separates the transistor cell area 610 from the outer lateral surface 103. The edge area 690 is devoid of any active transistor cells. The edge area 690 may include idle transistor cells that cannot change between an on-state and an off-state, that do not include source zones that are directly connected to a load electrode at the front side, or both.

The edge area 690 includes an edge construction 190, which may directly adjoin to the transistor cell area 610. The edge construction 190 may be separated from the outer lateral surface 103 at least in the corners of the semiconductor portion 100. A width of the edge construction 190 may vary. For example, a width of the edge construction 190 may increase with decreasing distance to a horizontal corner or the semiconductor portion 100. According to another embodiment the width of the edge construction 190 is uniform along the complete circumference of the transistor cell area 610.

An inner field confining structure formed along or in a distance d=d1 to an outer edge of the transistor cell area 610 forms an inner boundary of the edge construction 190. An outer field confining structure, which may be equally spaced from the inner field confining structure, forms an outer edge of the edge construction 190 at a distance d=d2 to the outer edge of the transistor cell area 610. Along the first surface 101, a lateral electric field is mainly accommodated between the inner and outer field confining structures. In a vertical projection of the inner and outer field confining structures, the electric field strength does not change or changes only to a low degree in the lateral direction. In the semiconductor portion 100 the total electric field strength resulting from overlapping lateral and vertical electric fields may reach local maximum values in the vertical projection of the inner and outer field confining structures at or close to d=d1 and d=d2.

The field confining structures confine a lateral electric field formed between the inner and outer field confining structures and may surround the transistor cell area 610 in the lateral directions.

The inner field confining structure may be formed by an outer portion of a first load electrode 310 directly electrically connected to the active transistor cells TC, a field electrode, a metal gate electrically separated from the semiconductor portion 100 by a field dielectric, or a gate conductor structure, which may be of heavily doped polycrystalline silicon, wherein the gate conductor structure electrically connects gate electrodes of the active transistor cells TC with the metal gate.

The outer field confining structure may be or may include a heavily doped barrier region extending from the first surface 101 into the semiconductor portion 100. The heavily doped barrier region may directly adjoin to the outer lateral surface 103 or may be spaced from the outer lateral surface 103. According to other embodiments the outer confining structure may include an edge field plate separated from the first surface 101 by a field dielectric.

The edge construction 190 may have approximately uniform width along the complete circumference of the transistor cell area 610. Straight sections 190a of the edge construction 190 extend parallel to straight portions of the outer lateral surface 103. Corner sections 190b of the edge construction 190 may be bowed or chamfered and seamlessly connect neighboring straight sections 190a.

In the following a first conductivity type is that of source zones of the active transistor cells TC and a second conductivity type is that of body zones of the active transistor cells TC.

A first dopant ratio between a mean dopant concentration of the second conductivity type, e.g., p-type for n-FET cells, and a mean dopant concentration of the complementary first dopant type in the straight sections 190a differs from a second dopant ratio between a mean dopant concentration of the second conductivity type and a mean dopant concentration of the first conductivity type in the corner section 190b of the edge construction 190 by at least 0.2%, e.g., at least 1%, or at least 2% in relation to the first dopant ratio.

In case the edge construction 190 includes a superjunction structure, a deviation of the second dopant ratio from the first dopant ratio may be achieved by a variation of the compensation ratio p/n between the oppositely doped first and second semiconductor regions of the superjunction structure. For example, in the straight sections 190a a first compensation ratio p/n may be in a range from about 0.5 to 1 and a second compensation ratio in the corner sections 190b may differ from the first compensation ratio by at least 0.1%, e.g., by at least 0.5% or at least 1% in relation to the first compensation ratio.

Typically, the edge construction 190 shapes the electric field along the first surface 101 between the transistor cell area 610 and the outer lateral surface 103 such that in the blocking state the total electric field strength does not exceed 2.0E05 V/cm, for example, 1.5E05 V/cm, wherein the electric field strength is approximately equal at any distance to the first surface 101 in the semiconductor portion 100. The total electric field strength may have two local maximum values along an inner edge and along the outer edge.

Typically, the dopant ratio is the same for the whole circumferential edge construction 190. By locally varying the dopant ratio between the mean dopant concentration of the first conductivity type and the mean dopant concentration of the second conductivity type in the corner sections 190b with respect to the straight sections 190a, the two maximum values of the electric field strength are also approximately equal in the corner sections 190b. In this way, the breakdown behavior in the corner sections 190b is approximated to the breakdown behavior in the straight sections 190a.

By contrast, conventionally, the first and second dopant ratios are equal. As a consequence, along the interface to the transistor cell area 610 the local electrical field maximum in the corner section 190b exceeds the corresponding electric field maximum in the straight sections 190a such that the rate of occurrence for avalanche breakdown is locally increased. A locally increased rate of occurrence for avalanche breakdowns may have adverse impact on device reliability.

Figure 1B:
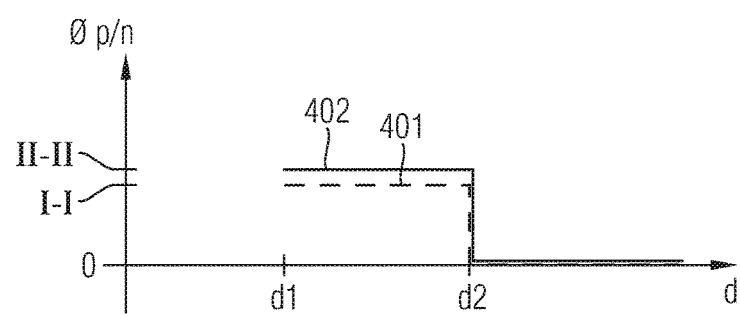
FIG. 1B is a diagram schematically illustrating mean dopant ratios along lines I-I and II-II in FIG. 1A.

In FIG. 1B, d1 and d2 indicate the positions of the inner and outer edge of the edge construction 190. A first mean dopant ratio 401 between dopants of the second conductivity type and dopants of the first conductivity type in the straight sections 190a is lower than a second mean dopant ratio 402 in the bowed or chamfered corner sections 190b.

Outside of the edge construction 190 between d2 and the outer lateral surface 103, the semiconductor portion 100 typically includes only one type of dopants such that the mean dopant ratio may be about zero both in the regions directly adjoining to the straight sections 190a and in the regions directly adjoining to the corner sections 190b.

Within the edge construction 190 the first and second mean dopant ratios may be constant from an inner edge of the edge construction at d=d1 to the outer edge at d=d2, may vary, or may differ from each other only in a portion of the edge construction 190.

Figure 1C:
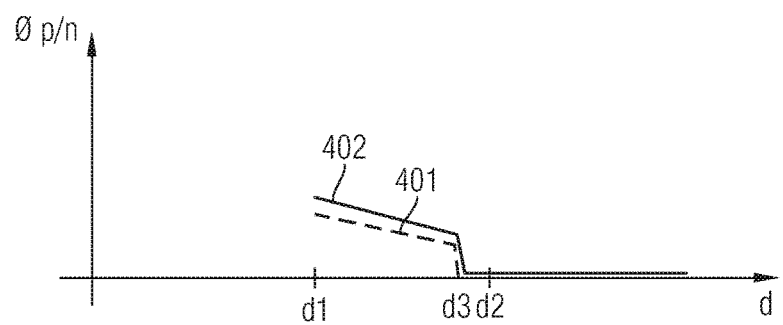
FIG. 1C is a diagram schematically illustrating mean dopant ratios along lines in a corner section and in a straight section of an edge construction according to another embodiment.

In FIG. 1C the first and second dopant ratios are different from each other in only an inner portion between d=d1 and d=d3, in which both dopant ratios may be constant or may vary, e.g., steadily decrease with increasing distance to d1, and are equal, e.g., equal to zero in an outer portion between d=d3 and d=d2.

Figure 1D:
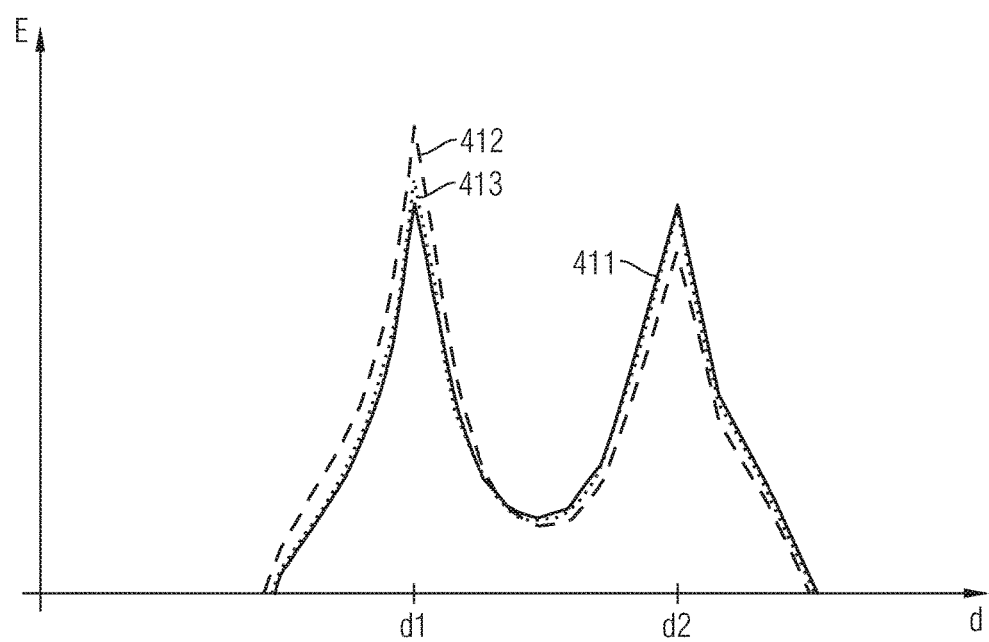
FIG. 1D is a diagram schematically illustrating electric field strengths along lines I-I and II-II in FIG. 1A.

In FIG. 1D continuous line 411 shows the electric field gradient in the straight sections with two local maxima at d=d1 and d=d2, wherein the maximum values at d1 and d2 are approximately equal. Dashed line 412 shows the electric field gradient for conventional corner sections 190b with the same mean dopant ratio as in the straight sections 190a. Due to the smaller radius of curvature along the inner field confining structure at d=d1 overlapping lateral field components result in a higher local maximum of the electric field gradient 412 than along the outer field confining structure at d=d2.

Dotted line 413 shows the electric field gradient along line II-II of FIG. 1A in the corner section 190b in case the mean dopant concentration of the second conductivity type is suitably increased by, e.g., 1% with respect to the mean dopant concentration of the second conductivity type in the straight section. The increased concentration of dopants of the second conductivity type in the corner section 190b results in that the two local maximum values of the electric field strength approximate to each other and to the electric field gradient 411 in the straight sections 190a. The overall maximum value is reduced and the avalanche behavior of the corner section 190b approximates to that of the straight sections 190a.

Figure 2:
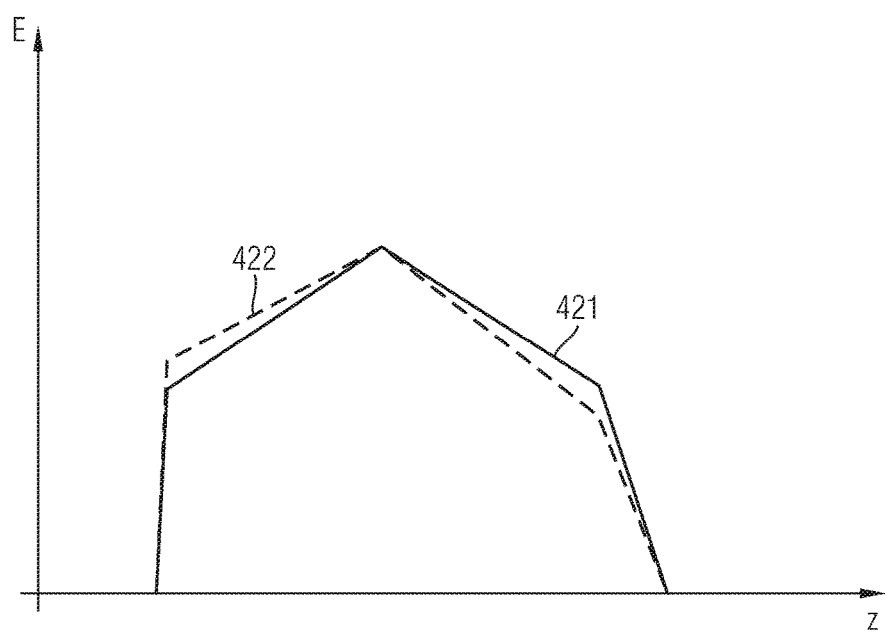
FIG. 2 is a diagram schematically comparing vertical electric field gradients in a corner portions of semiconductor devices for discussing effects of the embodiments.

In FIG. 2 continuous line 421 shows the gradient of the vertical electric field strength in straight sections of an edge construction of the transistor cell area 610. Dashed line 422 shows the corresponding electric field gradient at the edge of the transistor cell area 610 to the corner section. By locally increasing the dopant ratio between the concentration of dopants of the second conductivity type and the concentration of dopants of the first conductivity type in the corner section 190b by about 0.5% with respect to the straight section, the vertical electric field more closely approximates the electric field gradient at the edge of the transistor cell area 610 to the straight sections 190a.

Figure 3A:
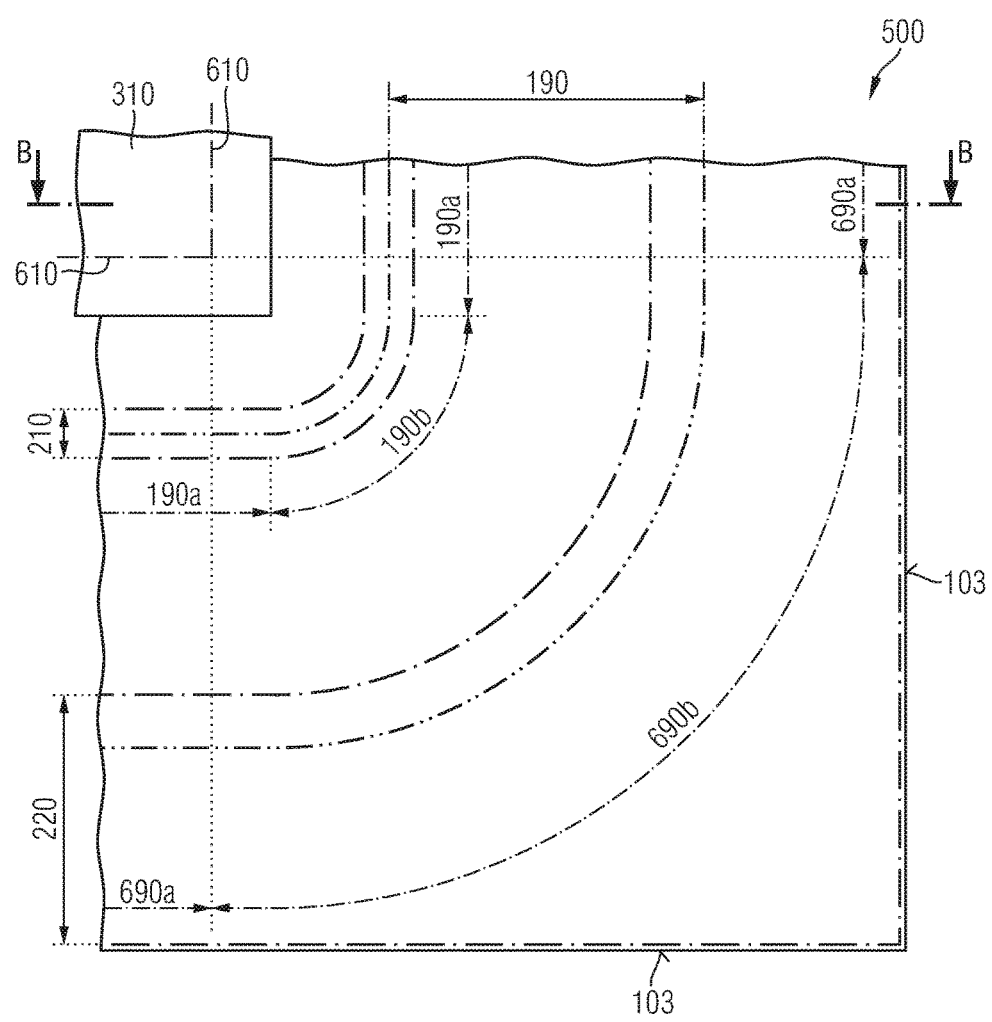
FIG. 3A is a schematic plan view of a corner portion of a semiconductor device including an edge construction between an inner field confining structure and an outer field confining structure according to an embodiment.
Figure 3B:
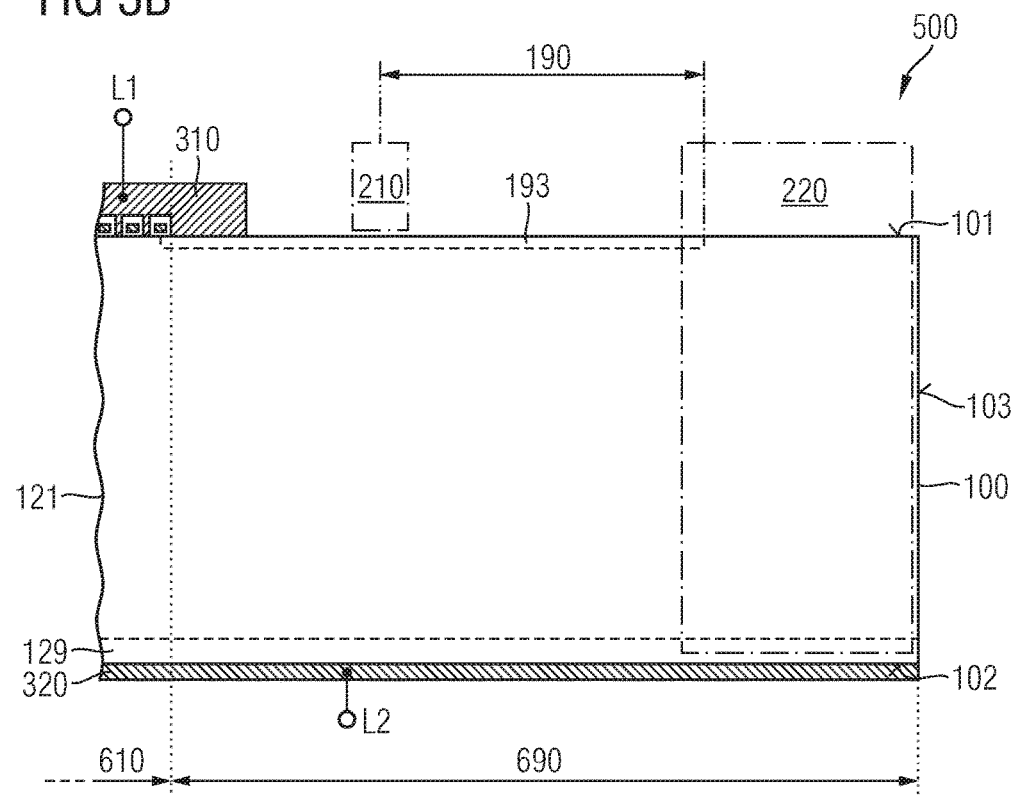
FIG. 3B is a schematic vertical cross-sectional view of the semiconductor device of FIG. 3A along line B-B.
Figure 3C:
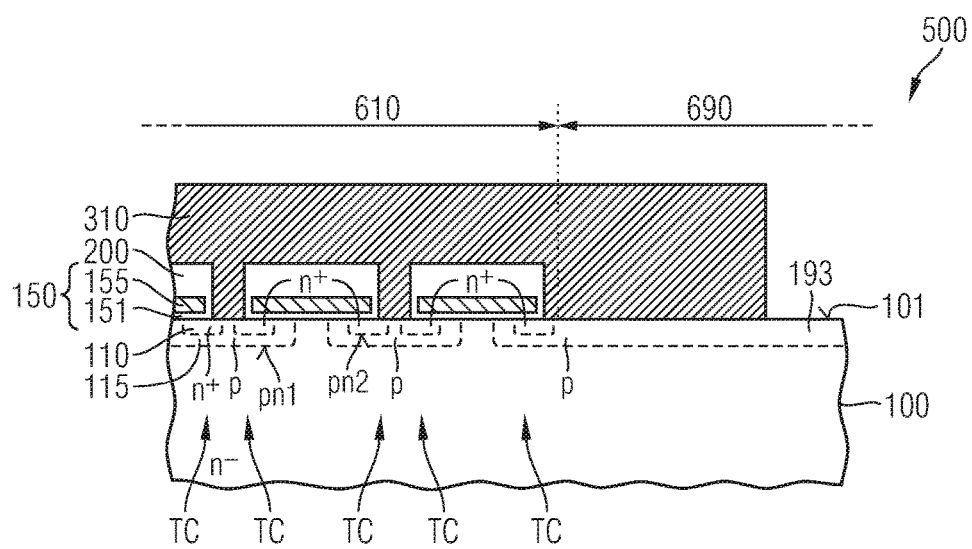
FIG. 3C is an enlarged view of a portion of FIG. 3B.

FIGS. 3A to 3C show a semiconductor device 500 including a plurality of active transistor cells TC. The active transistor cells TC may be field effect transistor cells, for example field effect transistor cells of the enhancement mode. The semiconductor device 500 may be or may include an IGFET. A material of the semiconductor portion 100 may be crystalline silicon.

The semiconductor portion 100 includes a drift layer 121 of a first conductivity type as well as a contact structure 129 between the drift layer 121 and the second surface 102. A dopant concentration in the drift layer 121 may gradually or in steps increase or decrease with increasing distance to the first surface 101 at least in portions of its vertical extension and/or may include one or more pn-junctions. According to other embodiments the dopant concentration in the drift layer 121 may be approximately uniform. A mean dopant concentration in the drift layer 121 may be between $5E12$ $cm^{-3}$ and $1E15$ $cm^{-3}$, for example in a range from $5E13$ $cm^{-3}$ to $5E14$ $cm^{-3}$. The drift layer 121 may embed further doped regions such as a superjunction structure, wherein a mean net dopant concentration in the superjunction structure may be, for example, in a range from $1E15$ $cm^{-3}$ to $1.5E16$ $cm^{-3}$, by way of example.

The contact structure 129 may be of the first conductivity type in case the semiconductor device 500 is or includes an IGFET, of the second conductivity type in case the semiconductor device 500 is a reverse blocking IGBT, or may include zones of both conductivity types in case the semiconductor device 500 is an RC-IGBT (reverse conducting IGBT). A dopant concentration in the contact structure 129 along the second surface 102 is sufficiently high to form an ohmic contact with a metal directly adjoining to the second surface 102. In case the semiconductor portion 100 is based on silicon, along the second surface 102 a dopant concentration may be at least $1E18$ $cm^{-3}$, for example, at least $5E19$ $cm^{-3}$ in an n-type contact structure 129 and at least $1E16$ $cm^{-3}$, for example, at least $5E17$ $cm^{-3}$ in a p-type contact structure 129.

The active transistor cells TC are formed in a section of the semiconductor portion 100 along the first surface 101. The active transistor cells TC may be field effect transistor cells with planar gate electrodes or with trench gate electrodes. Each active transistor cell TC includes a portion of a body zone 115 of the second conductivity type forming first pn junctions pn1 with the drift layer 121. Each active transistor cell includes a source zone 110 forming a second pn junction pn2 with the adjoining body zone 115. The body zones 115 may be wells extending from the first surface 101 into the semiconductor portion 100. The source zones 110 may be wells extending from the first surface 101 into the body zones 115. Typically, an outer edge of the outermost source zone 110 connected to the first load electrode 310 marks an interface between transistor cell area 610 and edge area 690.

A gate structure 150 includes a conductive gate electrode 155 which may include or consist a heavily doped polycrystalline silicon layer or a metal-containing layer. The gate structure 150 further includes a gate dielectric 151 separating the gate electrode 155 from the semiconductor portion 100, wherein the gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

According to the illustrated embodiment the gate structure 150 is a lateral gate formed outside of the semiconductor portion. 100 along the first surface 101. According to another embodiment the gate structure 150 is a trench gate extending from the first surface 101 into the semiconductor portion 100.

For the following description and for the following Figures it is assumed that the first conductivity type is n-type and the second conductivity type is p-type. Similar considerations as outlined below apply to embodiments with the first conductivity type being p-type and the second conductivity type being n-type.

When a voltage applied to the gate electrode 155 exceeds a preset threshold voltage, electrons accumulate in the channel portions of the body zones 115 directly adjoining the gate dielectric 151 and form inversion channels making the first and second pn junctions pn1 and pn2 transparent for electrons.

An interlayer dielectric 200 may insulate the gate electrodes 155 from a first load electrode 310. The interlayer dielectric 200 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315 extending through openings in the interlayer dielectric 200 may electrically connect the first load electrode 310 with the body zones 115 and the source zones 110, wherein the contact structures 315 may extend through the source zones 110 into the semiconductor portion 100 to contact the body zones 115 via a highly doped contact region. The first load electrode 310 may be or may be electrically coupled or connected to a first load terminal L1, for example to the source terminal of an n-IGFET.

A second load electrode 320, which directly adjoins to the second surface 102 and the contact structure 129, may form or may be electrically connected to a second load terminal L2, which may be the drain terminal of an n-IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent (s), e.g., a silicide, a nitride and/or an alloy.

An inner field confining structure 210 may confine the lateral electric field towards the transistor cell area 610. The inner field confining structure 210 may be an electrode structure including a conductive electrode and a field dielectric separating the electrode structure from the first surface 101.

An outer field confining structure 220 may confine the lateral electric field towards the outer lateral surface 103. The outer field confining structure 220 may be a further electrode structure with a conductive electrode electrically connected to a potential different from the potential applied to the conductive electrode of the inner field confining structure 210. For example, the outer field confining structure 220 may be a heavily doped barrier region within the semiconductor portion 100.

An edge construction 190 extends at least between the outer edge of the inner field confining structure 210 and the inner edge of the outer field confining structure 220 or may overlap with a portion of the inner field confining structure 210, with a portion of the outer field confining structure 220 or with both. In case the first load electrode 310 forms the inner field confining structure 210, the edge construction extends between the first load electrode 310 and the outer field confining structure 220.

The variation of the dopant concentration may be uniform in the complete corner section 190b, may decrease or increase with increasing distance to the transistor cell area 610 or may increase or decrease with increasing distance to the straight sections 190a. The variation of dopants may be uniform across a portion of the vertical extension of the semiconductor portion 100 or may vertically vary.

The variation of the mean dopant ratio may result from a modification of an implant mask and may concern one or more functional doped regions in the edge termination 190.

Figure 4A:
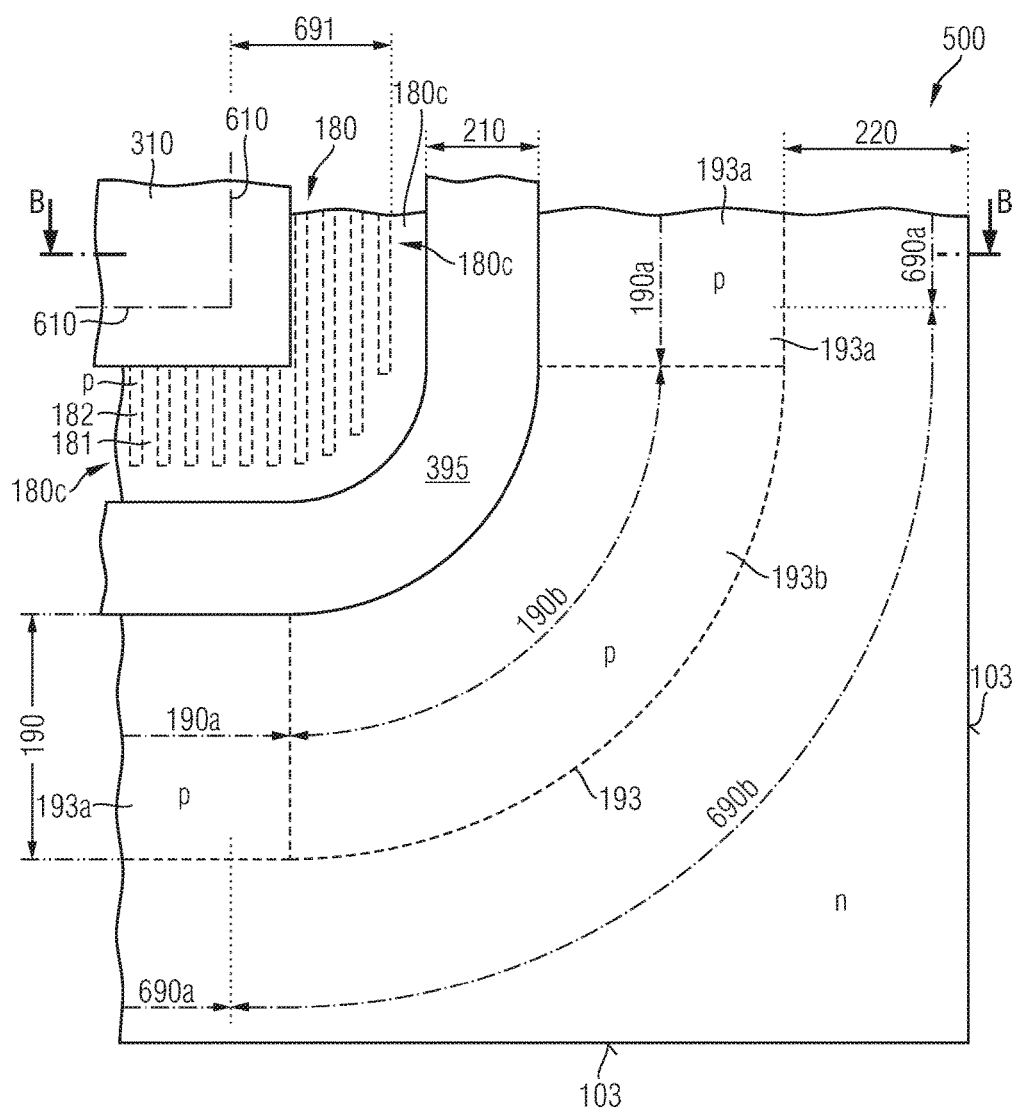
FIG. 4A is a schematic plan view of a corner portion of a semiconductor device according to an embodiment with field electrodes forming the inner and outer field confining structures.
Figure 4B:
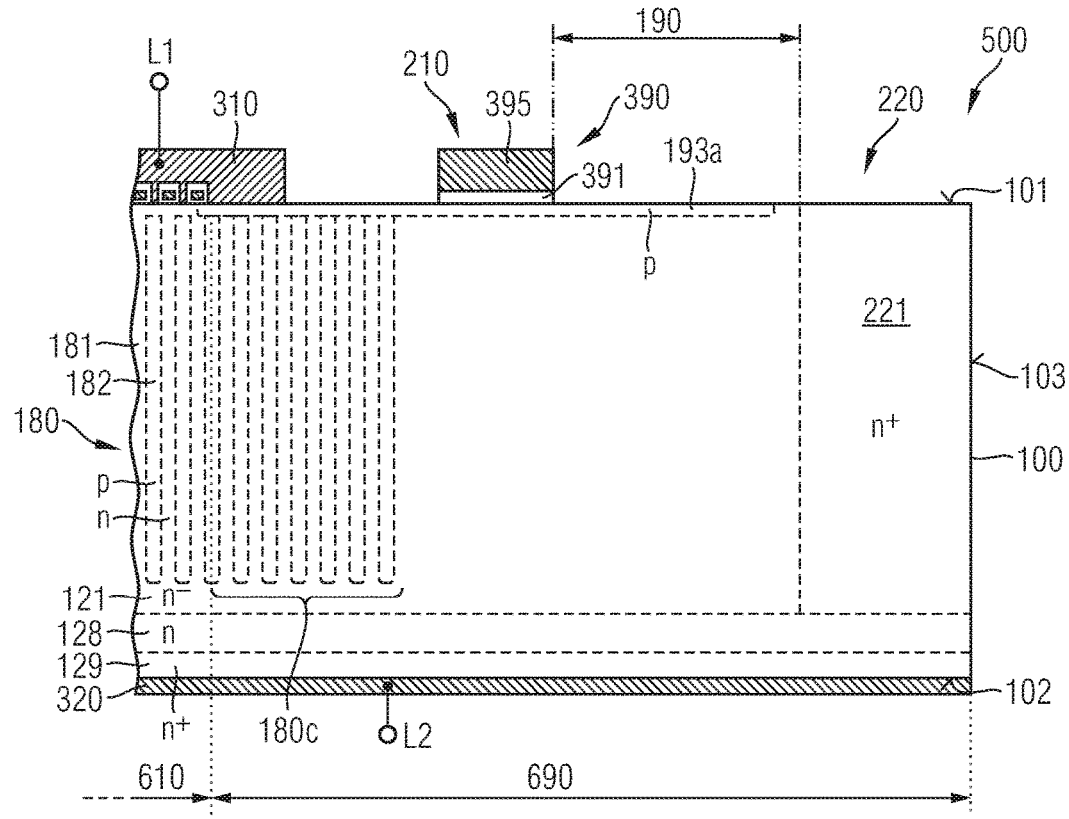
FIG. 4B is a schematic vertical cross-sectional view of the corner portion of FIG. 4A along line B-B.
Figure 4C:
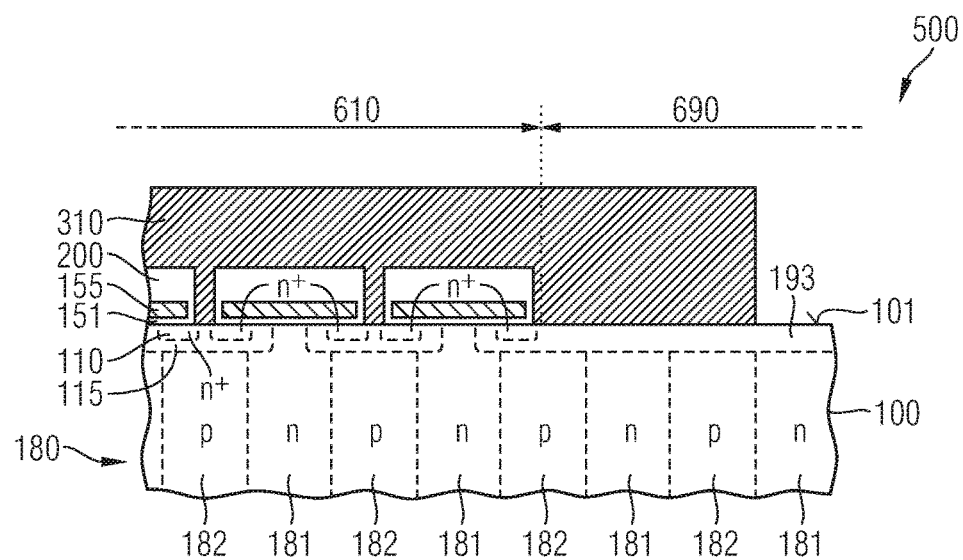
FIG. 4C is an enlarged view of a portion of FIG. 4B.

FIGS. 4A to 4C show a semiconductor device 500 with a drift layer 121 including a superjunction structure 180 forming a compensation structure. The superjunction structure 180 includes first semiconductor regions 181 of the first conductivity type and second semiconductor regions 182 of the second conductivity type. The charges in the first and second semiconductor regions 181, 182 approximately cancel out each other.

The first and second semiconductor regions 181, 182 alternate along at least one horizontal direction. The first and second semiconductor regions 181, 182 may be formed by depositing material containing n-type dopants and p-type dopants into trenches temporarily formed in the drift layer 121 and partially outdiffusing the dopants into remnant portions of the original drift layer 121, wherein surfaces that connect points of equal dopant concentration in the first and second semiconductor regions 181, 182 are not undulated and are parallel to the contour of the temporary trenches. The surfaces that connect points of equal dopant concentration do not show concave portions or notches. According to other embodiments, the first and second semiconductor regions 181, 182 are formed by sequentially growing epitaxial layers and implanting the dopants for the first and second semiconductor regions 181, 182 into the epitaxial layers, wherein in the resulting first and second semiconductor regions 181, 182 surfaces connecting points of equal dopant concentrations are undulated and show more than two or three concave portions.

The dopant concentrations in the first and second semiconductor regions 181, 182 may be adjusted to each other such that a portion of the drift layer 121 including the superjunction structure 180 can be completely depleted in a blocking state of the semiconductor device 500.

The superjunction structure 180 may be formed exclusively in the transistor cell area 610. According to the illustrated embodiment the superjunction structure 180 extends into an inner edge area 691 directly adjoining to the transistor cell area 610. First and second semiconductor regions 181, 182 of the superjunction structure 180 may cross the transistor cell area 610 such that sections of the first and second semiconductor regions 181, 182 extend into the inner edge area 691. Further first and second semiconductor regions 181, 182 extending parallel to those first and second semiconductor regions 181, 182 that cross the transistor cell area 610 may be formed on opposite sides of the transistor cell area 610 in the inner edge area 691.

A field stop layer 128 of the conductivity type of the drift layer 121 may separate the drift layer 121 from the contact structure 129. A mean impurity concentration in the field stop layer 128 may be at least 150% of the mean impurity concentration in the drift layer 121 and at most 20% of a maximum impurity concentration in the contact structure 129.

A heavily doped barrier region 221 of the first conductivity type may extend from the first surface 101 into the semiconductor portion 100, e.g., to or into the field stop layer 128, to or into the contact structure 129 or to the second surface 102 such that the potential of the second load electrode 320 is accessible at the front side. The barrier region 221 is effective as the outer field confining structure 220.

A field electrode structure 390 may be effective as inner field confining structure 210. The field electrode structure 390 includes a field dielectric 391 electrically separating a conductive field electrode 395 from the first surface 101.

The edge construction 190 includes doped areas, for example an outer portion of the drift layer 121 of the first conductivity type or a portion of a junction termination extension 193 of the second conductivity type.

In the corner section 190b of the edge construction 190 the dopant concentration of dopants of the second conductivity type is slightly increased with respect to the straight section 190a and/or the concentration of dopants of the first conductivity type is slightly reduced with respect to the straight section 190a.

For example, the semiconductor device 500 of FIGS. 4A and 4B may include a junction termination extension 193 with straight sections 193a and corner sections 193b. The junction termination extension 193 is structurally connected to the outermost body zone 115 and has the same conductivity type as the body zones 115. The junction termination extension 193 extends from the transistor cell area 610 outwardly into the direction of the outer lateral surface 103. The junction termination extension 193 may directly adjoin to the first surface 101 or may be separated from the first surface 101.

The straight section 193a of the junction termination extension 193 is in the straight section 190a of the edge construction 190 and the corner section 193b of the junction termination extension 193 is in the corner section 190b of the edge construction 190. In the corner sections 193b of the junction termination extension 193 the area density of dopants of the first conductivity type is greater than in the straight sections 193a such that a local increase of an electric field strength along the metal gate 330 is avoided.

Figure 5A:
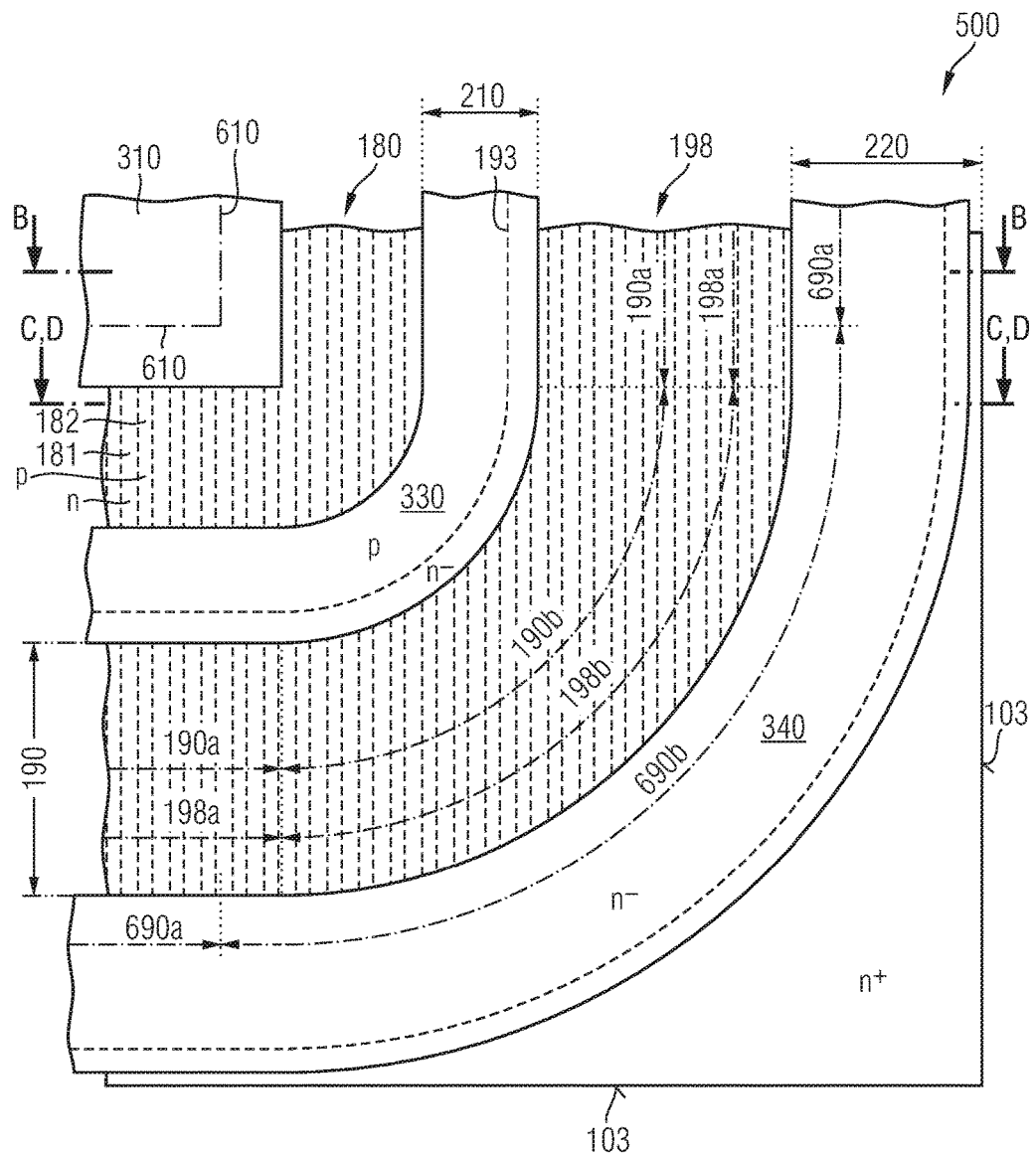
FIG. 5A is a schematic plan view of a corner portion of a semiconductor device according to an embodiment with a termination section of a superjunction structure including differently doped straight and corner sections.

In FIGS. 5A and 5B a portion of a gate construction, e.g., a metal gate 330 forming a ring-shaped structure surrounding at least partly the first load electrode 310 forms the inner field confining structure 210. A portion of the interlayer dielectric 200 which covers portions of the first surface 101 in the edge area 690 forms an inner field dielectric 331 separating the metal gate 330 from the semiconductor portion 100.

An edge field plate 340 between the edge construction 190 and the outer lateral surface 103 may form the outer field confining structure 220. A further portion of the inter-layer dielectric 200 may form an outer field dielectric 341 separating the edge field plate 340 from the semiconductor portion 100. The edge field plate 340 may be electrically connected to a heavily doped barrier region 221 extending into or through the field stop layer 128.

A superjunction structure 180 includes a termination section 198 formed as part of the edge construction 190. The termination section 198 may extend through the complete edge construction 190 or may be formed only in an inner portion of the edge construction 190 oriented to the transistor cell area 610, wherein an outer portion of the edge construction 190 oriented to the outer lateral surface 103 is free of first and second semiconductor regions 181, 182 of a superjunction structure 180 and may be or include a weakly doped region of the first conductivity type.

In the termination section 198 at least some or all of the first and second semiconductor regions 181, 182 of the superjunction structure 180 may directly adjoin to the first surface 101 or may be separated from the first surface 101. The termination section 198 may extend outwardly from the transistor cell area 610 up to or beyond the inner edge of the outer field confining structure 220 or may extend only into a portion of the edge construction 190 such that the termination section 198 is equally spaced from the inner edge of the outer field confining structure 220.

The termination section 198 has a straight section 198a in the straight section 190a of the edge construction 190 and a corner section 198b in the corner section 190b of the edge construction 190. The corner section 198b of the termination section 198 is more p-loaded than the straight sections 198a such that a local increase of total electric field strength along the edge of the metal gate 330 is avoided.

The difference in the charge balance within the corner sections 190b with respect to the charge balance within the straight sections 190a may be uniform across the complete corner section 190b or may change along the vertical direction, may change along the lateral direction, and/or may depend on the distance to the straight sections 190a. Transitions between portions of the corner sections 190b with different charge balance may be steep or may be smooth.

In FIG. 5C the corner section 198b of the termination section 198 of the superjunction structure 180 includes a vertical sub-section 198c in which the ratio between a mean p-dopant concentration and a mean n-dopant concentration is locally increased with respect to the straight sections 198a and with respect to further vertical sub-sections of the corner section 198b outside of the vertical sub-section 198c. The vertical sub-section 198c may be formed closer to the first surface 101 or closer to the second surface 102. The heavily doped barrier region 221 may extend down to the contact structure 129.

The corner section 198b of FIG. 5D includes a lateral sub-section 198d that extends at least from the inner field confining structure 210 into the edge construction 190 and that is spaced from the outer field confining structure 220. In the lateral sub-section 198d the ratio between a mean p-dopant concentration and a mean n-dopant concentration is locally increased with respect to the straight sections 198a and with respect to a further lateral sub-section between the lateral sub-section 198d and the outer field confining structure 220. The heavily doped barrier region 221 may extend down to the second surface 102.

Figure 5E:
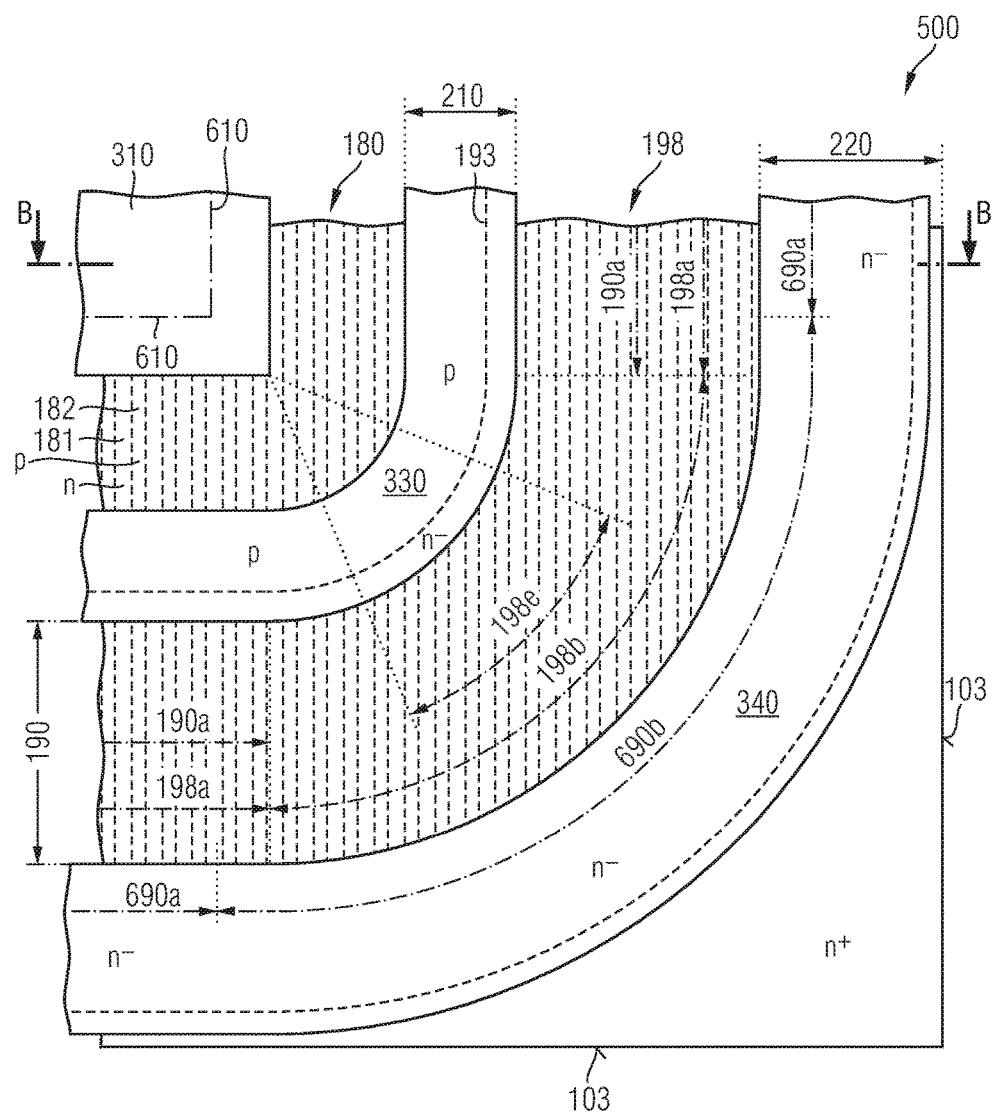
FIG. 5E is a schematic plan view of a corner portion of a semiconductor device according to another embodiment with a termination section of a superjunction structure including differently doped straight and corner sections and an angle-dependent variation of doping within a corner section.

In FIG. 5E the corner section 198b of the termination section 198 of the superjunction structure 180 includes an angular sub-section 198e in which the ratio between a mean p-dopant concentration and a mean n-dopant concentration is locally increased with respect to the straight sections 198a and with respect to further angular sub-sections of the corner section 198b between the angular sub-section 198e and the neighboring straight sections 190a.

Figure 6B:
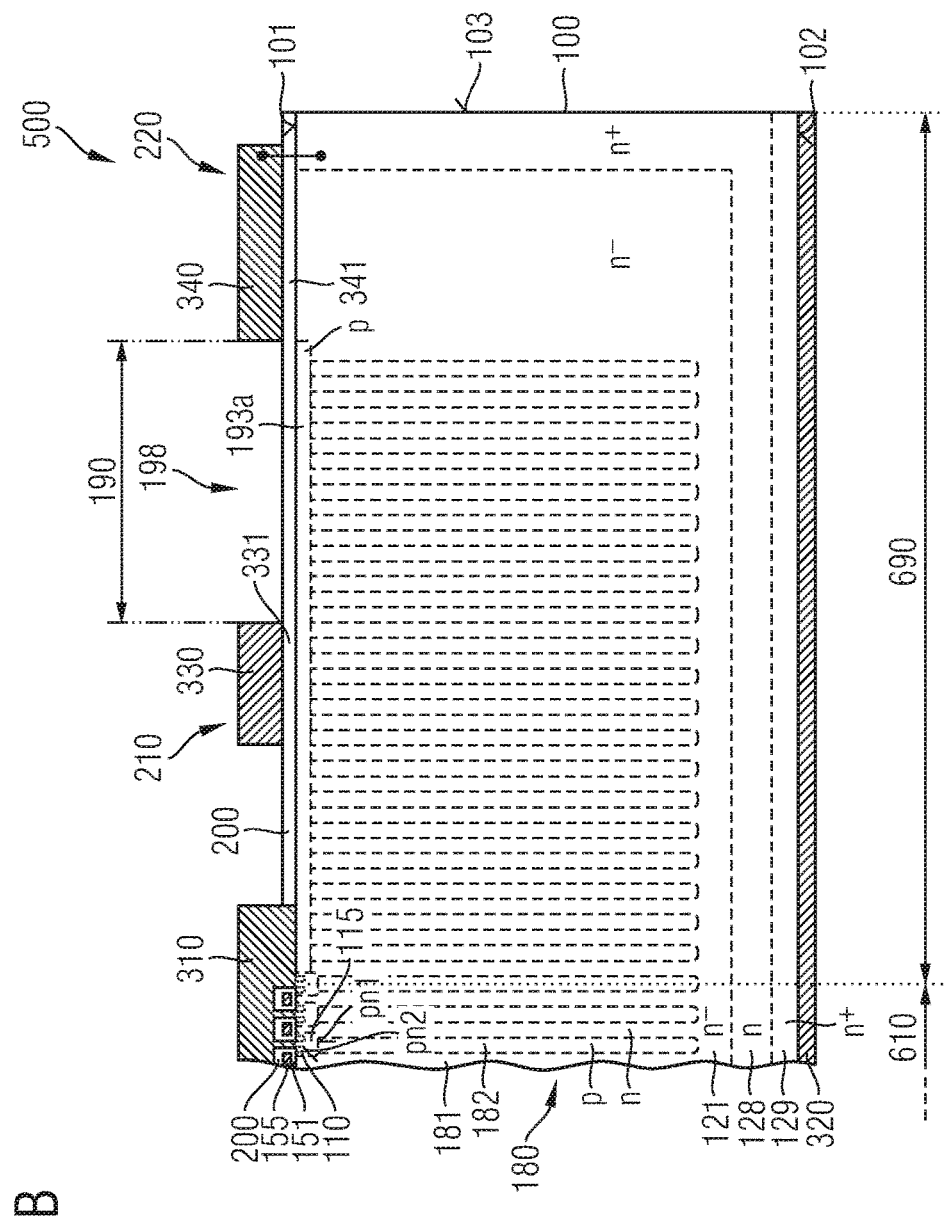
FIG. 6B is a schematic vertical cross-sectional view of the corner portion of FIG. 6A along line B-B.

In addition to a superjunction structure 180, the semiconductor device 500 of FIGS. 6A and 6B includes a junction termination extension 193 which is structurally connected to the outermost body zone 115 and which has the same conductivity type as the body zone 115. The junction termination extension 193 extends from the transistor cell area 610 outwardly into the direction of the outer lateral surface 103. The junction termination extension 193 may directly adjoin to the first surface 101 or may be separated from the first surface 101. The junction termination extension 193 may be formed between the first surface 101 and at least a part of the termination section 198 of the superjunction structure 180.

The junction to extension 193 has a straight section 193a in the straight section 190a of the edge construction 190 and a corner section 193b in the corner section 190b of the edge construction 190. The area density of p-type dopants in the corner sections 193b of the junction termination extension 193 is greater than in the straight sections 193a such that a local increase of electric field strength along the metal gate 330 is avoided.

Figure 7A:
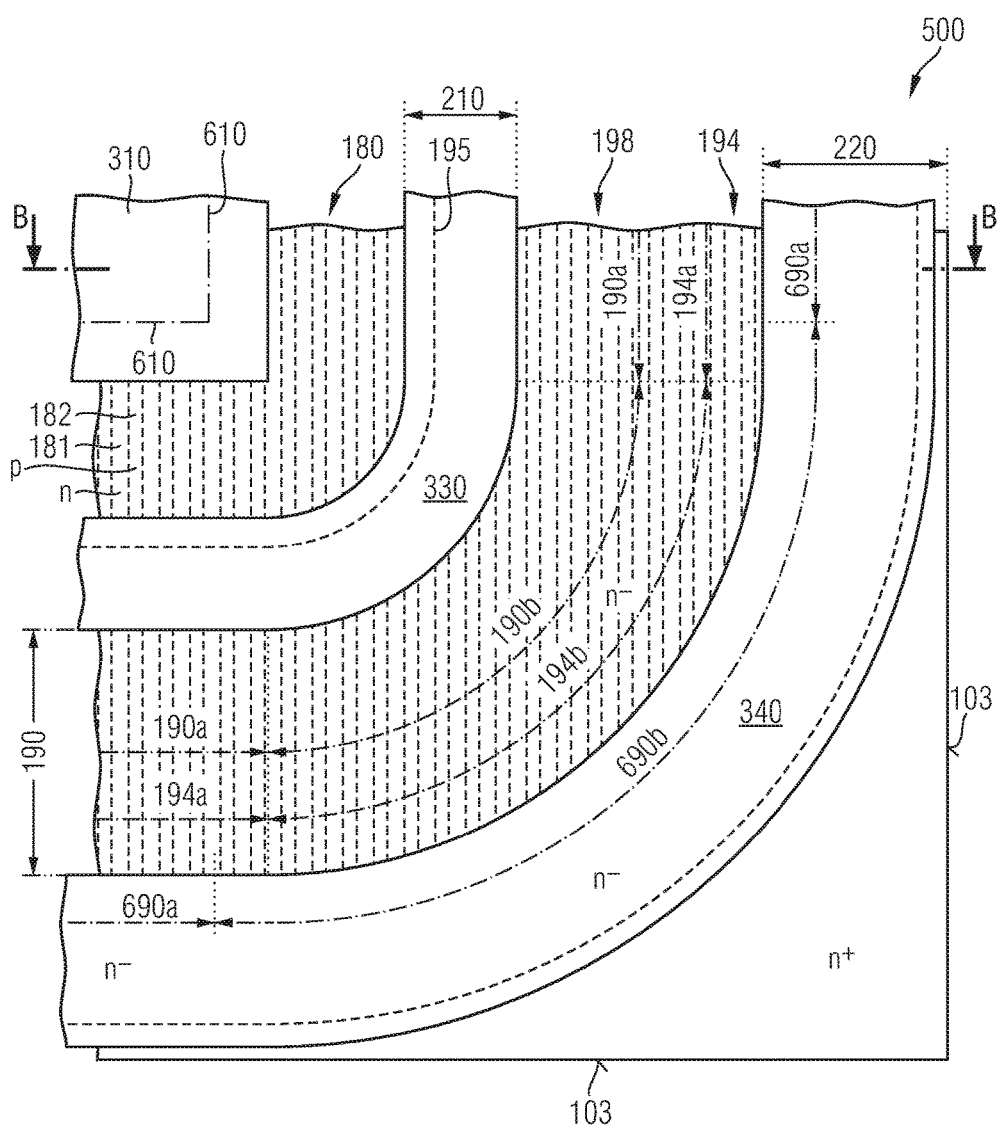
FIG. 7A is a schematic plan view of a corner portion of a semiconductor device according to an embodiment including a spacer zone with differently doped straight and corner sections, wherein the spacer zone separates the junction termination extension from a first surface of a semiconductor portion.
Figure 7B:
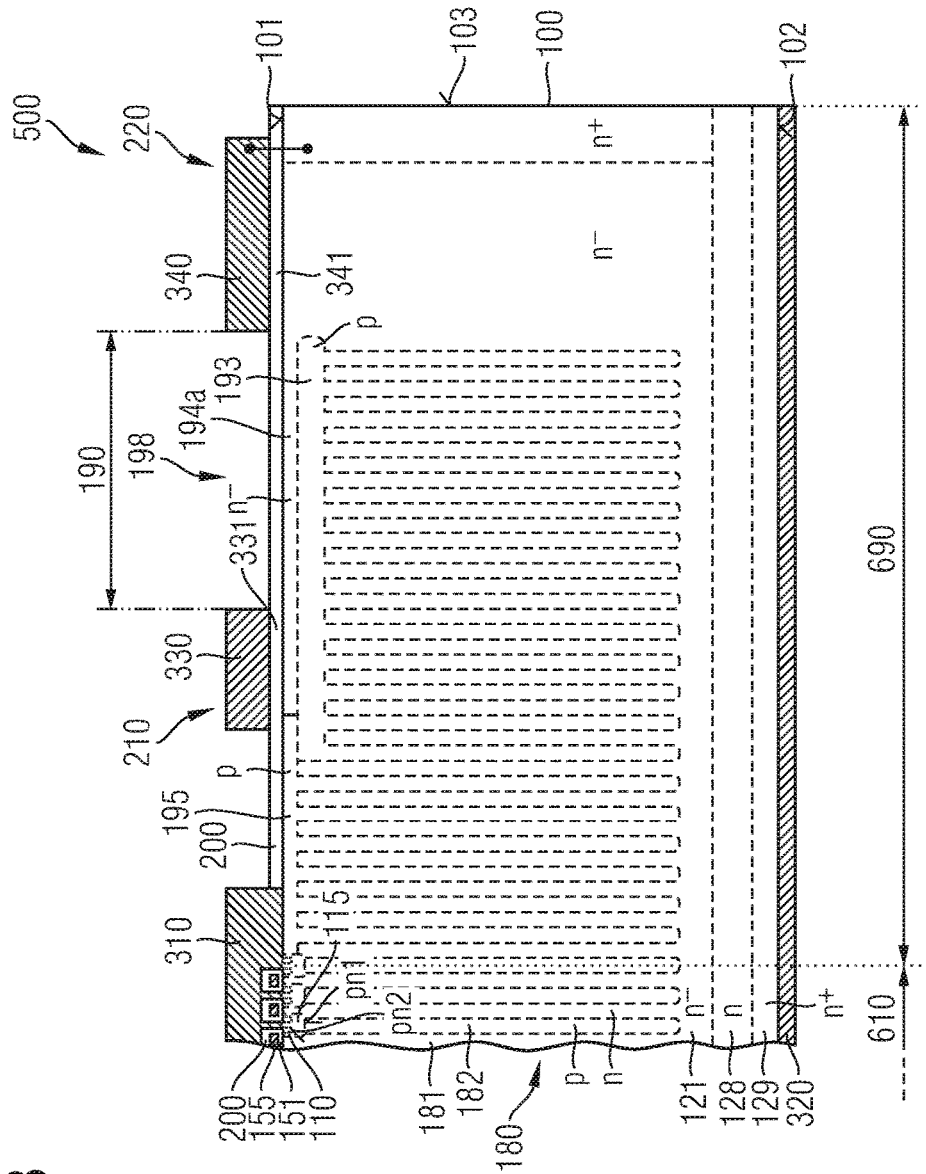
FIG. 7B is a schematic vertical cross-sectional view of the corner portion of FIG. 7A along line B-B.

In the semiconductor device 500 of FIGS. 7A and 7B a body extension zone 195, which is structurally connected to the outermost body zone 115 and which is of the same conductivity type as the body zones 115, extends from the transistor cell area 610 outwardly into the direction of the outer field confining structure 220. A mean dopant concentration in the body extension zone 195 may be equal to that in the body zones 115 and is at least 100% higher than in the junction termination extension 193.

A junction termination extension 193 may laterally directly adjoin to the body extension zone 195. Vertical projections of the body extension zone 195 and the inner field confining structure 210 may overlap. A spacer zone 194 forms a pn junction with the junction termination extension 193 and separates the junction termination extension 193 from the first surface 101.

The spacer zone 194 includes straight sections 194a in the straight sections 190a of the edge construction and corner sections 194b in the corner sections 190b of the edge construction 190. The mean area density of n-type dopants in the corner sections 194b of the spacer zone 194 is lower than in the straight sections 194a. The lower mean area density of n-type dopants an the corner sections 194b prevents an increase of a local field maximum along the metal gate 330.

Figure 8A:
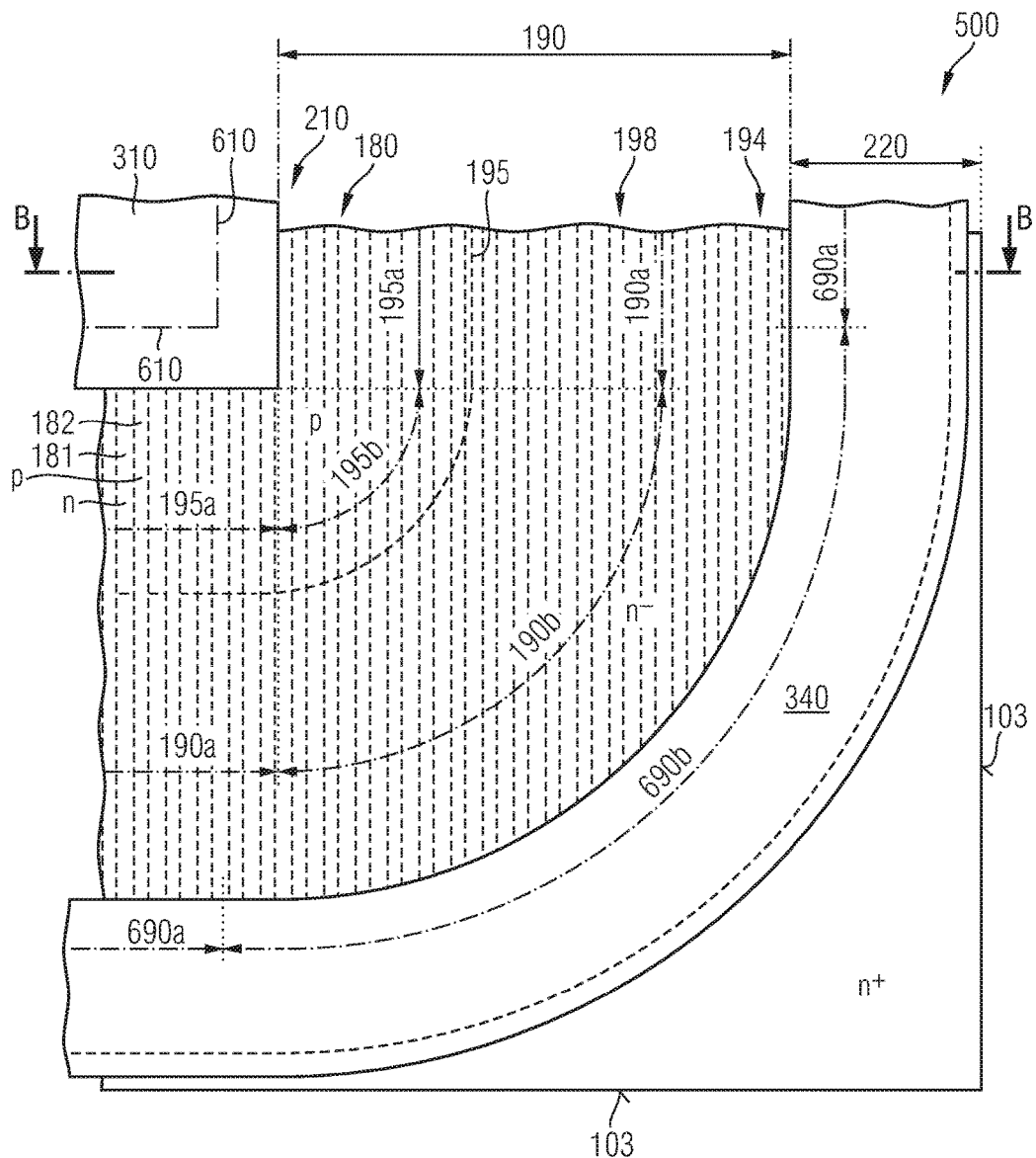
FIG. 8A is a schematic plan view of a corner portion of a semiconductor device according to an embodiment including a body extension zone with differently doped straight and corner sections.
Figure 8B:
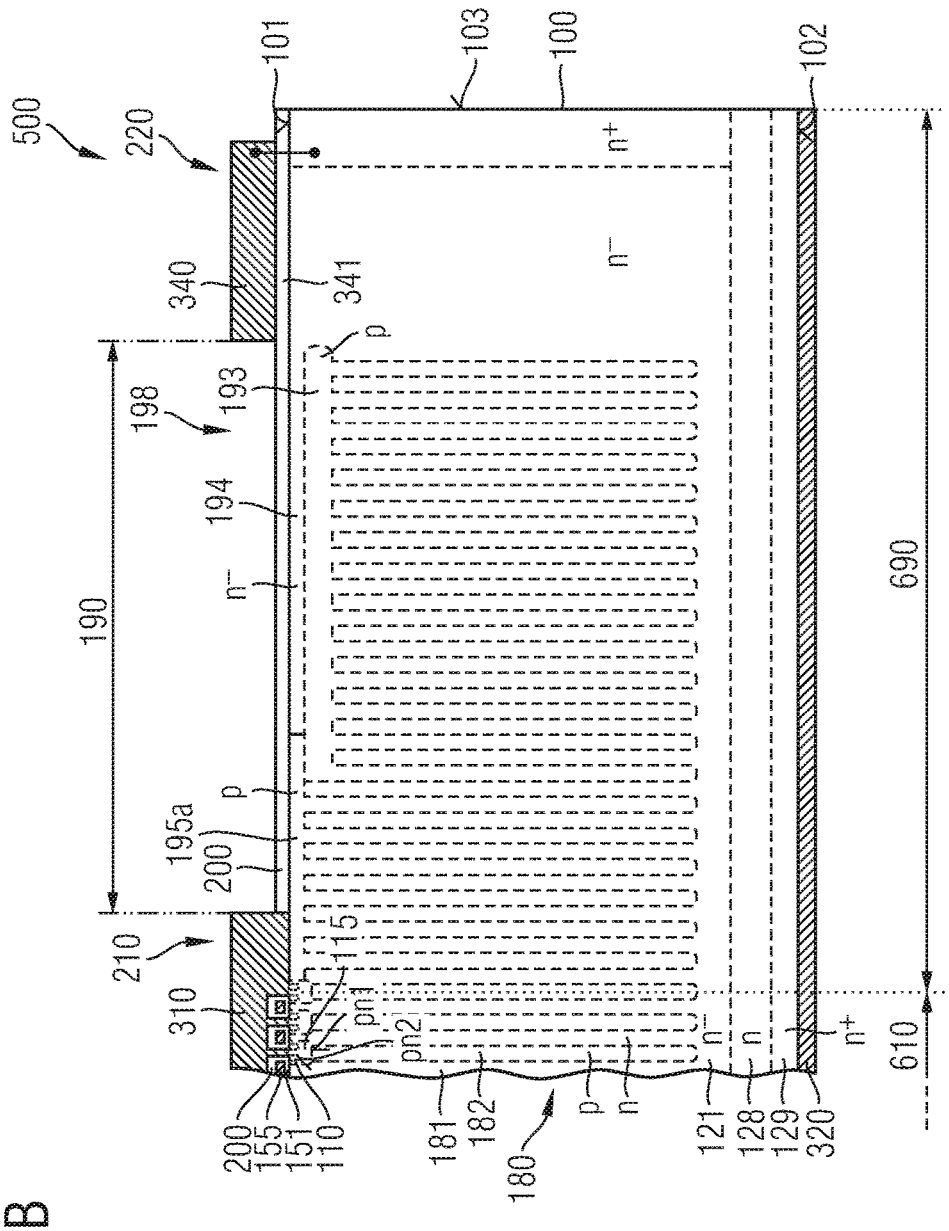
FIG. 8B is a schematic vertical cross-sectional view of the corner portion of FIG. 8A along line B-B.

FIGS. 8A and 8B refer to a semiconductor device 500 with a body extension zone 195 extending into the edge construction 190. The body extension zone 195 is structurally connected to the outermost body zone 115, has the same conductivity type as the body zones 115, and extends from the transistor cell area 610 outwardly to beyond the inner field confining structure 210, wherein in the illustrated embodiment the first load electrode 310 forms the inner field confining structure 210.

The body extension zone 195 has a straight section 195a in the straight section 190a of the edge construction and a corner section 195b in the corner section 190b of the edge construction 190. The mean area density of p-type dopants in the corner section 195b of the body extension zone 195 is higher than in the straight section 195a such that a maximum value of the electric field strength is not locally increased along the edge of the first load electrode 310.

The above-described modifications in the corner sections 190b may be combined in various ways. The modifications may affect also dopant variations in adjoining portions of the edge area 690 and the transistor cell area 610 outside of the edge construction 190.

Figure 9A:
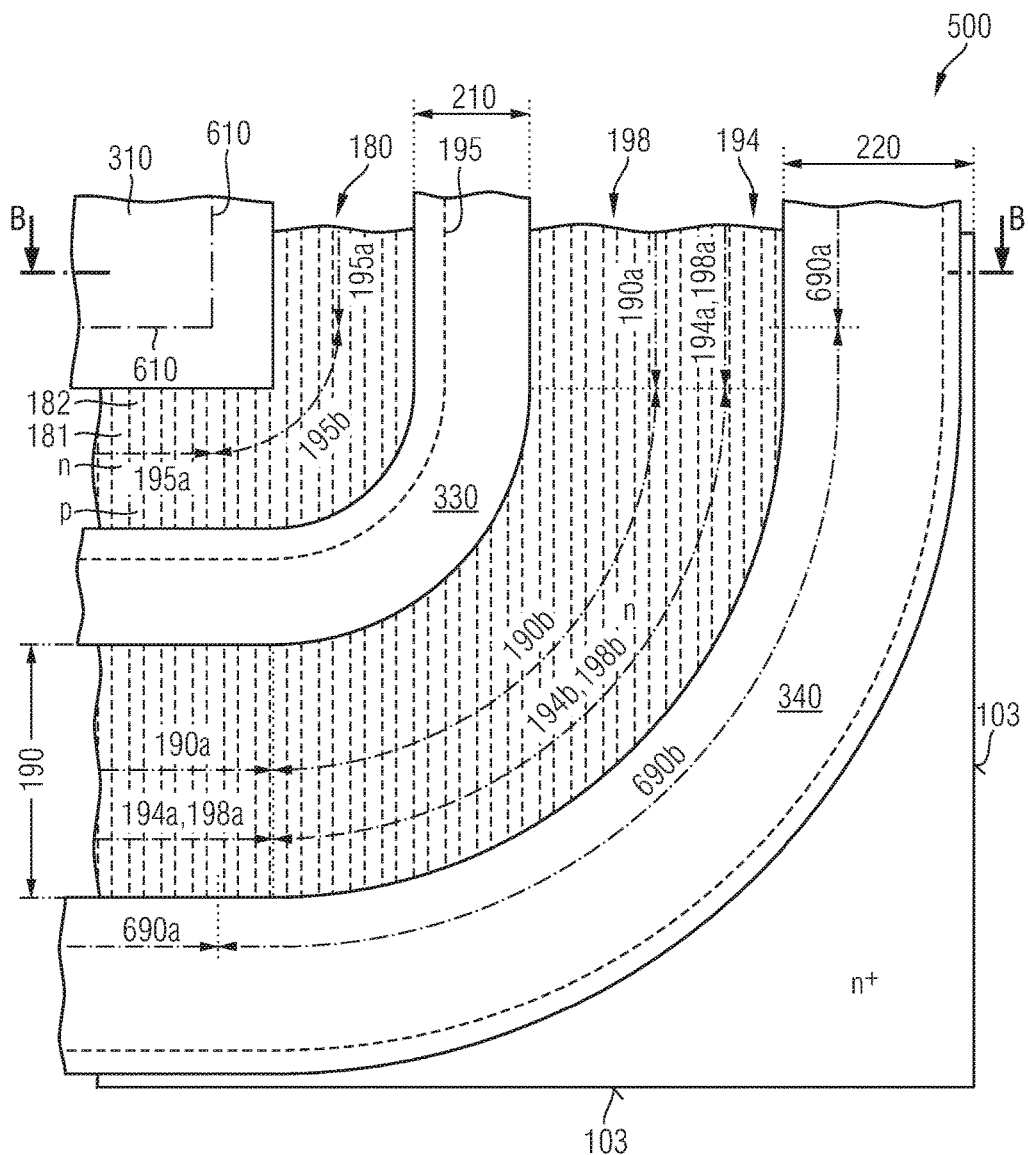
FIG. 9A is a schematic plan view of a corner portion of a semiconductor device according to an embodiment combining modifications of a plurality of doped structures in the corner sections.

In FIGS. 9A and 9B the corner section 190b of the edge construction 190 includes a first vertical sub-section 190c including the corner section 193b of the junction termination extension 193, the corner section 194b of the spacer zone 194 and a first vertical section of the corner section 198b of the termination section 198 of the superjunction structure 180. A second vertical sub-section 190d includes a second vertical sub-section 190d of the corner section 198b of the termination section 198 of the superjunction structure 180.

In the first vertical sub-section 190c the p-dopant concentration is about 1% higher than in the corresponding vertical sub-section of the straight section 190a. In the second vertical sub-section 190d the p-dopant concentration is about 0.5% higher than in the corresponding vertical sub-section of the straight section 190a. The dopant variation may also concern portions of the semiconductor portion 100 outside of the edge construction 190 and oriented to the transistor cell area 610, e.g., the body extension zone 195 and the body zones 115 of the outermost transistor cells TC.

The vertical modification of the charge balance may be effective across the complete corner section 190b of the edge construction 190 or only in parts thereof. The different vertical sub-sections may have the same or different lateral extensions.

Figure 9C:
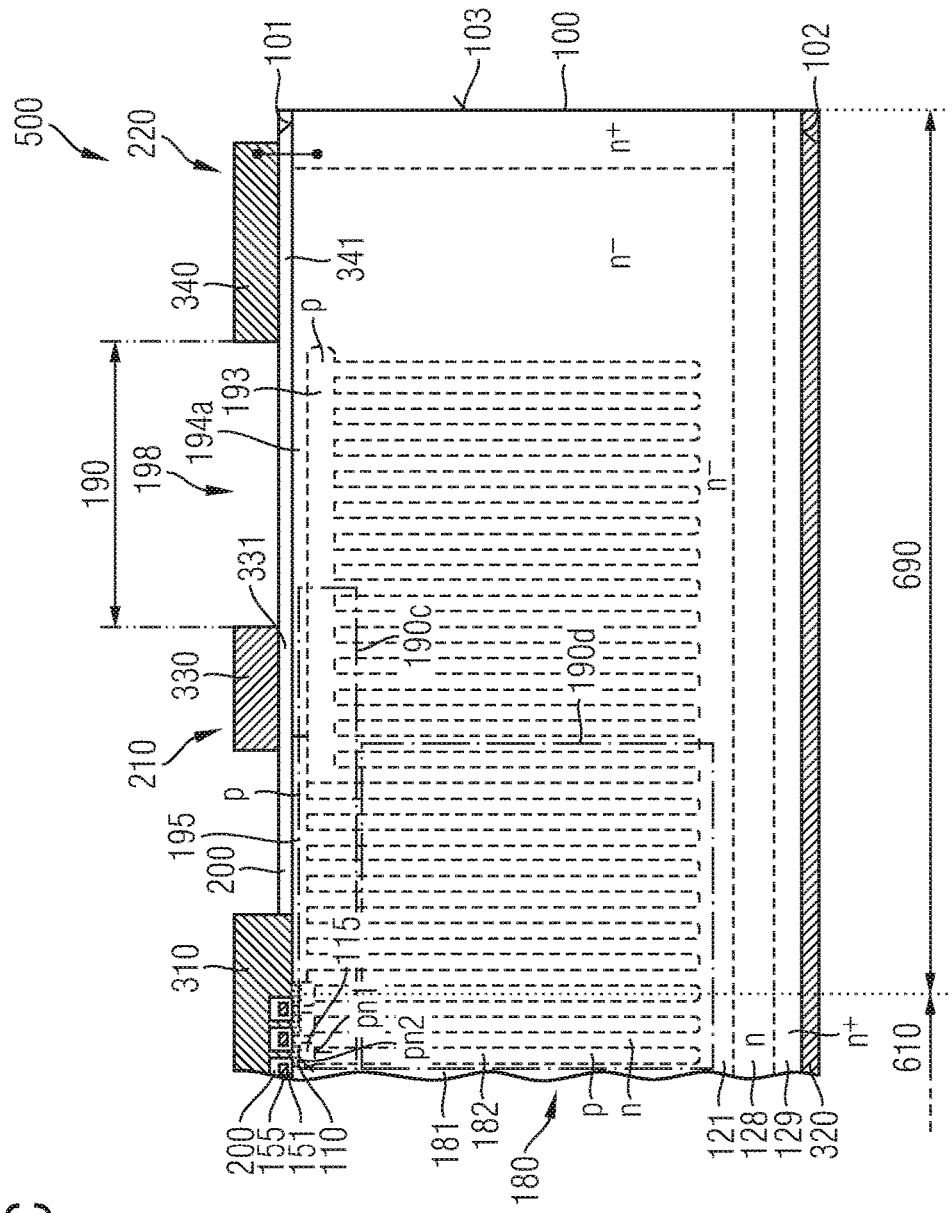
FIG. 9C is a schematic vertical cross-sectional view of the corner portion of FIG. 9A along line B-B according to another embodiment combining modifications of a plurality of doped structures in the corner sections.

In FIG. 9C the first vertical sub-section 190c includes outer portions of the transistor cell area 610 and extends outwardly up to and beyond the inner field confining structure 210. A lateral extension of the second vertical sub-section 190d is smaller than the lateral extension of the first vertical sub-section 190c.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    an active transistor cell area comprising active transistor cells that comprise source zones electrically connected to a first load electrode, wherein the source zones have a first conductivity type;
    an edge area surrounding the active transistor cell area and comprising an edge construction extending from an inner field confining structure oriented to the active transistor cell area to a second field confining structure between the inner field confining structure and an outer lateral surface of a semiconductor portion that comprises the source zones of the active transistor cells,
    wherein the edge construction comprises straight sections and a corner section connecting neighboring straight sections,
    wherein a second dopant ratio between a mean concentration of dopants of a complementary second conductivity type and a mean concentration of dopants of the first conductivity type in the corner section exceeds a first dopant ratio between a mean concentration of dopants of the second conductivity type and a mean concentration of dopants of the first conductivity type in the straight sections by at least 0.2% in relation to the first dopant ratio.

2. The semiconductor device of claim 1, wherein the second dopant ratio exceeds the first dopant ratio by at least 1% in relation to the first dopant ratio.

3. The semiconductor device of claim 1, wherein the first conductivity type is n-type.

4. The semiconductor device of claim 1, wherein the second dopant ratio exceeds the first dopant ratio by at least 0.2% and at most by about 1% in relation to the first dopant ratio.

5. The semiconductor device of claim 1, wherein the inner field confining structure comprises the first load electrode.

6. The semiconductor device of claim 1, wherein the inner field confining structure comprises a metal gate formed at a distance to a first surface of the semiconductor portion.

7. The semiconductor device of claim 1, wherein the inner field confining structure comprises a gate conductor structure electrically connecting gate electrodes of the active transistor cells with a metal gate formed in a distance to a first surface of the semiconductor portion.

8. The semiconductor device of claim 1, wherein the outer field confining structure comprises a heavily doped barrier region extending from a first surface of the semiconductor portion into the semiconductor portion.

9. The semiconductor device of claim 1, wherein the outer field confining structure comprises an edge field plate and a field dielectric separating the edge field plate from a first surface of the semiconductor portion.

10. The semiconductor device of claim 1, wherein the semiconductor portion comprises a superjunction structure comprising first semiconductor regions of the first conductivity type and second semiconductor regions of the second conductivity type.

11. The semiconductor device of claim 10, wherein the superjunction structure comprises a termination section formed in the edge construction, wherein straight sections of the termination section formed in the straight sections of the edge construction have a first p/n compensation ratio between the first and second semiconductor regions, and wherein corner sections of the termination sections formed in the corner sections of the edge construction have a second p/n compensation ratio different than the first p/n compensation ratio.

12. The semiconductor device of claim 11, wherein the second p/n compensation ratio exceeds the first p/n compensation ratio by at least 0.1% in relation to the first p/n compensation ratio.

13. The semiconductor device of claim 10, wherein the termination section is formed in the complete edge construction.

14. The semiconductor device of claim 10, wherein the termination section is formed in an inner portion of the edge construction and an outer portion of the edge construction is devoid of a superjunction structure.

15. The semiconductor device of claim 10, further comprising:
    a junction termination extension of the second conductivity type, wherein the junction termination extension is at least partly formed in the edge construction between a first surface of the semiconductor portion and the superjunction structure.

16. The semiconductor device of claim 15, wherein straight sections of the junction termination extension formed in the straight sections of the edge construction have a first mean dopant ratio and corner sections of the junction termination extension formed in the corner sections of the edge construction have a second mean dopant ratio.

17. The semiconductor device of claim 15, further comprising:
a spacer zone forming a pn junction with the junction termination extension and separating the junction termination extension from the first surface of the semiconductor portion.

18. The semiconductor device of claim 17, wherein straight sections of the spacer zone formed in the straight sections of the edge construction have a first mean dopant ratio and corner sections of the spacer zone formed in the corner sections of the edge construction have a second mean dopant ratio different than the first mean dopant ratio.

19. The semiconductor device of claim 10, further comprising:
a body extension zone forming a unipolar homojunction with a body zone in the active transistor cell area, the body extension zone formed between the first surface of the semiconductor portion and the superjunction structure.

20. The semiconductor device of claim 19, wherein straight sections of the body extension zone formed in the straight sections of the edge construction have a first mean dopant ratio and corner sections of the body extension zone formed in the corner sections of the edge construction have a second mean dopant ratio different than the first mean dopant ratio.

21. The semiconductor device of claim 1, wherein the corner section comprises a first sub-section with the second dopant ratio and further sub-sections with a dopant ratio equal or closer to the first dopant ratio.

22. The semiconductor device of claim 21, wherein the first sub-portion is a vertical sub-section.

23. The semiconductor device of claim 21, wherein the first sub-portion is a lateral sub-section.

24. The semiconductor device of claim 21, wherein the first sub-portion is an angular sub-section.

25. The semiconductor device of claim 21, wherein a transition from the first sub-section to the further sub-portion is continuous.

26. The semiconductor device of claim 1, wherein in the corner section of the edge construction a deviation of the second dopant ratio with respect to the first dopant ratio is uniform across the corner section.

* * * * *